(12) United States Patent
Lee et al.

(10) Patent No.: US 10,756,015 B2
(45) Date of Patent: Aug. 25, 2020

(54) SEMICONDUCTOR PACKAGE, PACKAGE-ON-PACKAGE DEVICE, AND METHOD OF FABRICATING THE SAME

(71) Applicant: Samsung Electronics Co., Ltd., Suwon-si, Gyeonggi-do (KR)

(72) Inventors: Seokhyun Lee, Hwaseong-si (KR); Kyung Suk Oh, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/703,233

(22) Filed: Dec. 4, 2019

(65) Prior Publication Data

US 2020/0111738 A1 Apr. 9, 2020

Related U.S. Application Data

(63) Continuation of application No. 16/136,622, filed on Sep. 20, 2018, now Pat. No. 10,541,201.

(30) Foreign Application Priority Data

Jun. 8, 2018 (KR) ........................ 10-2018-0066046

(51) Int. Cl.
| | |
|---|---|
| *H01L 29/80* | (2006.01) |
| *H01L 31/0288* | (2006.01) |
| *H01L 31/112* | (2006.01) |
| *H01L 23/522* | (2006.01) |
| *H01L 23/498* | (2006.01) |
| *H01L 23/538* | (2006.01) |

(Continued)

(52) U.S. Cl.
CPC .... *H01L 23/5226* (2013.01); *H01L 21/76877* (2013.01); *H01L 23/367* (2013.01); *H01L 23/49838* (2013.01); *H01L 23/5386* (2013.01); *H01L 24/09* (2013.01); *H01L 24/17* (2013.01); *H01L 2224/02331* (2013.01)

(58) Field of Classification Search
CPC .......... H01L 21/76877; H01L 23/5226; H01L 23/367; H01L 23/49838; H01L 23/5386; H01L 24/09; H01L 24/17
USPC ........................................................ 257/692
See application file for complete search history.

(56) References Cited

U.S. PATENT DOCUMENTS

| | | |
|---|---|---|
| 8,372,689 B2 | 2/2013 | Lee et al. |
| 8,928,153 B2 | 1/2015 | Haba et al. |

(Continued)

*Primary Examiner* — David S Blum
(74) *Attorney, Agent, or Firm* — Harness, Dickey & Pierce, P.L.C.

(57) ABSTRACT

A semiconductor package including a package substrate, a semiconductor chip on a first surface of the package substrate, a connection substrate on the package substrate and spaced apart from and surrounding the semiconductor chip, the connection substrate including a plurality of conductive connection structures penetrating therethrough, a plurality of first connecting elements between the semiconductor chip and the package substrate and electrically connecting the semiconductor chip to the package substrate, a plurality of second connecting elements between the connection substrate and the package substrate and electrically connecting the connection substrate to package substrate, a mold layer encapsulating the semiconductor chip and the connection substrate, and an upper redistribution pattern on the mold layer and the semiconductor chip and electrically connected to a corresponding one of the plurality of conductive connection structures may be provided.

20 Claims, 33 Drawing Sheets

(51) Int. Cl.
    *H01L 23/00*     (2006.01)
    *H01L 23/367*     (2006.01)
    *H01L 21/768*     (2006.01)

(56) References Cited

U.S. PATENT DOCUMENTS

| | | |
|---|---|---|
| 9,780,072 B2 | 10/2017 | Jeng et al. |
| 9,853,003 B1 | 12/2017 | Han et al. |
| 2016/0254249 A1 | 9/2016 | Jeng et al. |
| 2016/0343685 A1 | 11/2016 | Lin et al. |
| 2017/0033083 A1 | 2/2017 | Lin et al. |
| 2017/0103951 A1 | 4/2017 | Lee et al. |
| 2018/0053732 A1 | 2/2018 | Baek et al. |
| 2018/0076103 A1 | 3/2018 | Jeon et al. |
| 2018/0082933 A1 | 3/2018 | Ko et al. |
| 2018/0090444 A1 | 3/2018 | Lee et al. |

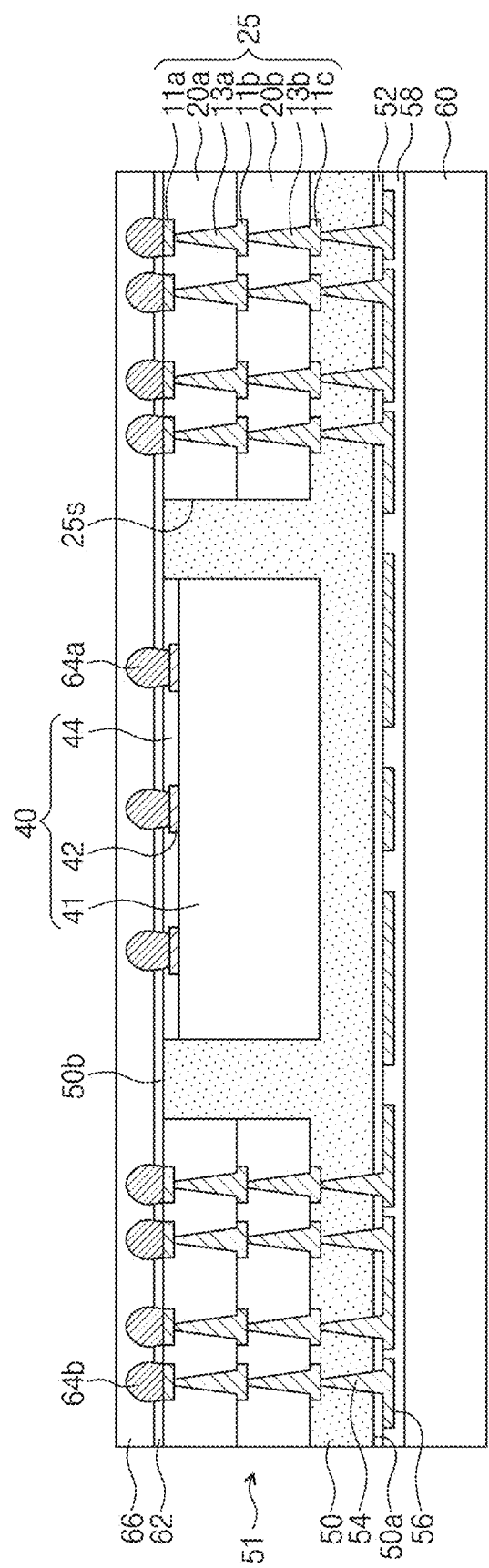

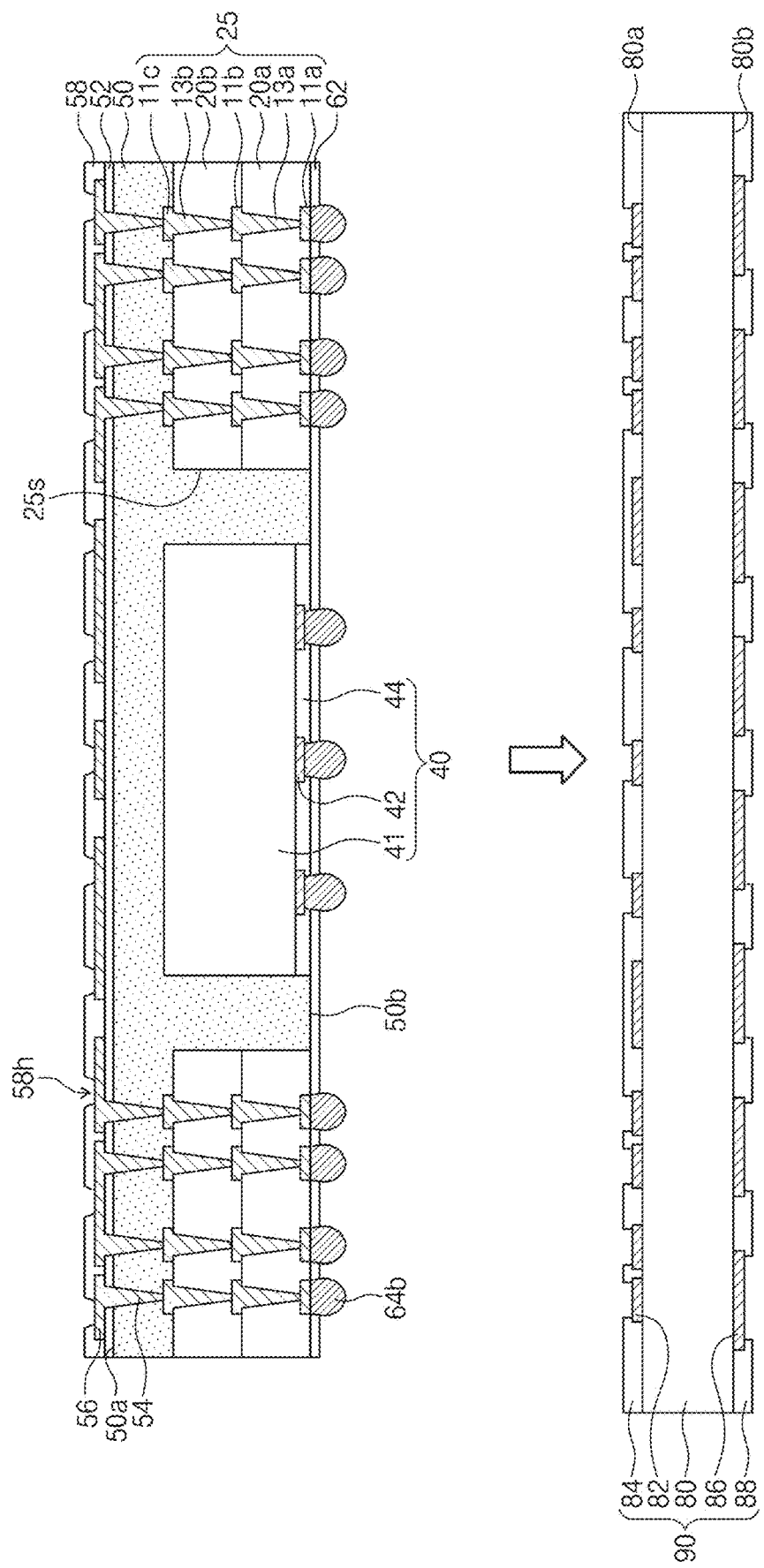

SEMICONDUCTOR PACKAGE, PACKAGE-ON-PACKAGE DEVICE, AND METHOD OF FABRICATING THE SAME

CROSS-REFERENCE TO RELATED APPLICATIONS

This U.S. non-provisional patent application is a continuation of U.S. application Ser. No. 16/136,622, now U.S. Pat. No. 10,541,201, filed on Sep. 20, 2018, which claims priority under 35 U.S.C. § 119 to Korean Patent Application No. 10-2018-0066046, filed on Jun. 8, 2018, in the Korean Intellectual Property Office, the entire contents of each of which are hereby incorporated by reference.

BACKGROUND

The present disclosure relates to semiconductor packages, package-on-package devices, and/or methods of fabricating the same.

In the case where an integrated circuit (IC) chip is provided in the form of a semiconductor package, it can be easily used as a part of an electronic product. In general, the semiconductor package includes a printed circuit board (PCB) and a semiconductor chip which is mounted on the PCB and is electrically connected to the PCB by bonding wires or bumps. With development of the semiconductor industry, many studies are being conducted to improve reliability and durability of such semiconductor packages.

SUMMARY

Some example embodiments of the inventive concepts provide highly reliable semiconductor packages, package-on-package devices including the same, and/or methods of fabricating the same.

According to an example embodiment of the inventive concepts, a semiconductor package may include a first package substrate, a first semiconductor chip on a first surface of the first package substrate, a plurality of first connecting elements between the first semiconductor chip and the first package substrate, the plurality of first connecting elements electrically connecting the first semiconductor chip to the first package substrate, a connection substrate on the first package substrate, the connection substrate spaced apart from and surrounding the first semiconductor chip, the connection substrate including two or more insulating layers that are sequentially stacked and a plurality of conductive structures each including at least two or more connection via portions and two or more connection conductive pattern portions that are electrically connected to each other, the two or more connection via portions penetrating corresponding ones of the two or more insulating layers, respectively, the two or more connection conductive pattern portions on corresponding ones of the two or more insulating layers, respectively, a plurality of second connecting elements between the connection substrate and the first package substrate, the plurality of second connecting elements electrically connecting the connection substrate to the first package substrate, a mold layer encapsulating the first semiconductor chip and the connection substrate, and an upper redistribution pattern on the mold layer and the first semiconductor chip, the upper redistribution pattern including a redistribution via portion and a redistribution conductive pattern portion, the redistribution via portion penetrating the mold layer and electrically connected to a corresponding one of the plurality of conductive structures, the redistribution conductive pattern portion being on the mold layer and connected to the redistribution via portion.

According to an example embodiment of the inventive concepts, a semiconductor package may include a package substrate, a semiconductor chip on a first surface of the package substrate, a connection substrate on the package substrate, the connection substrate spaced apart from and surrounding the semiconductor chip, the connection substrate including a plurality of conductive connection structures penetrating therethrough, a plurality of first connecting elements between the semiconductor chip and the package substrate, the plurality of first connecting elements electrically connecting the semiconductor chip to the package substrate, a plurality of second connecting elements between the connection substrate and the package substrate, the plurality of second connecting elements electrically connecting the connection substrate to package substrate, a mold layer encapsulating the semiconductor chip and the connection substrate, and an upper redistribution pattern on the mold layer and the semiconductor chip, the upper redistribution pattern electrically connected to a corresponding one of the plurality of conductive connection structures.

According to an example embodiment of the inventive concepts, a semiconductor package may include a first semiconductor unit package and a second semiconductor unit package. The first semiconductor unit package may include a first package substrate, a first semiconductor chip on a first surface of the first package substrate, a connection substrate on the first package substrate, the connection substrate spaced apart from and surrounding the first semiconductor chip, the connection substrate including a plurality of conductive connection structures penetrating therethrough, a plurality of first connecting elements between the first semiconductor chip and the first package substrate, the plurality of first connecting elements electrically connecting the first semiconductor chip to the first package substrate, a plurality of second connecting elements between the connection substrate and the first package substrate, the plurality of second connecting elements electrically connecting the connection substrate to the first package substrate, a mold layer encapsulating the first semiconductor chip and the connection substrate, and an upper redistribution pattern on the mold layer and the first semiconductor chip, the upper redistribution pattern electrically connected to a corresponding one of the a plurality of conductive connection structures. The second semiconductor unit package may be electrically connected to the upper redistribution pattern of the first semiconductor unit package, and may include a second package substrate, and a second semiconductor chip on a first surface of the second package substrate.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 4A, 4B, 4C, 4D, 4E, 4F, 4G, 4H, 4I, 4J, 4K, 4L, 4M, 4N, 4O, and 4P are sectional views sequentially illustrating a process of fabricating the semiconductor package of FIG. 2.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given example embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which some example embodiments are shown.

Figure 1:
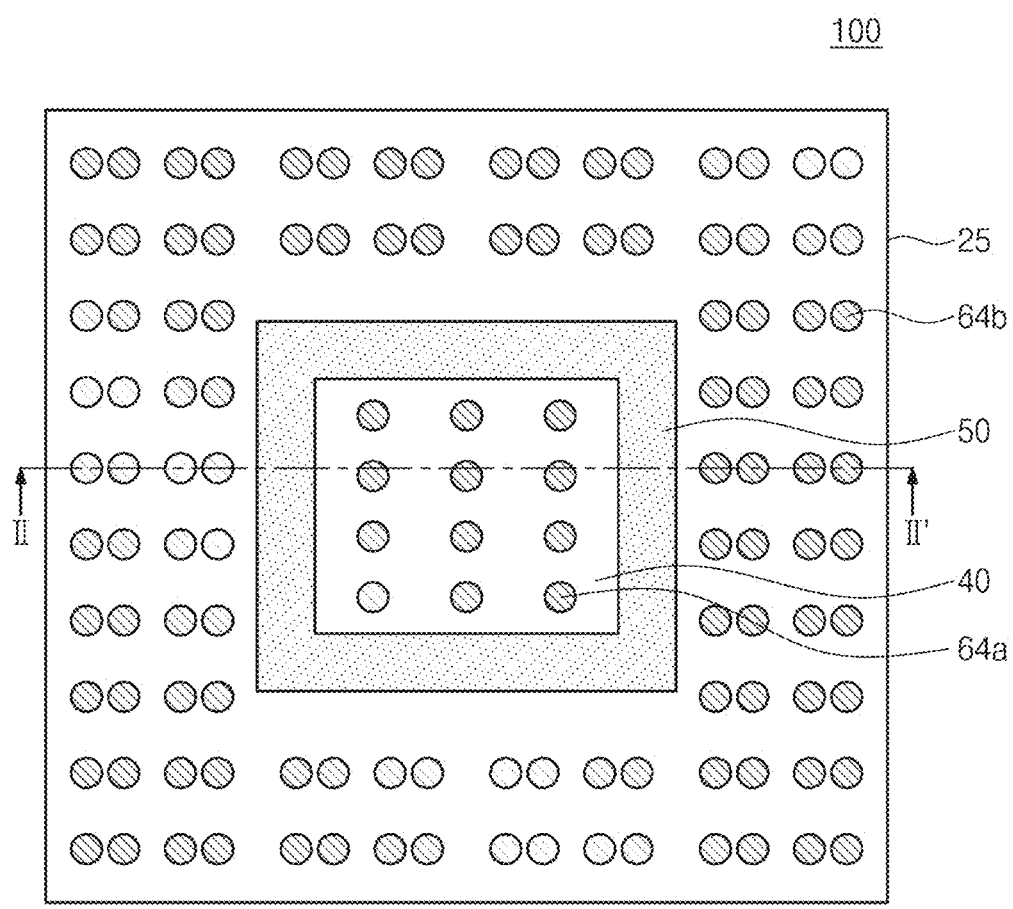
FIG. 1 is a plan view illustrating a semiconductor package according to an example embodiment of the inventive concepts.
Figure 2:
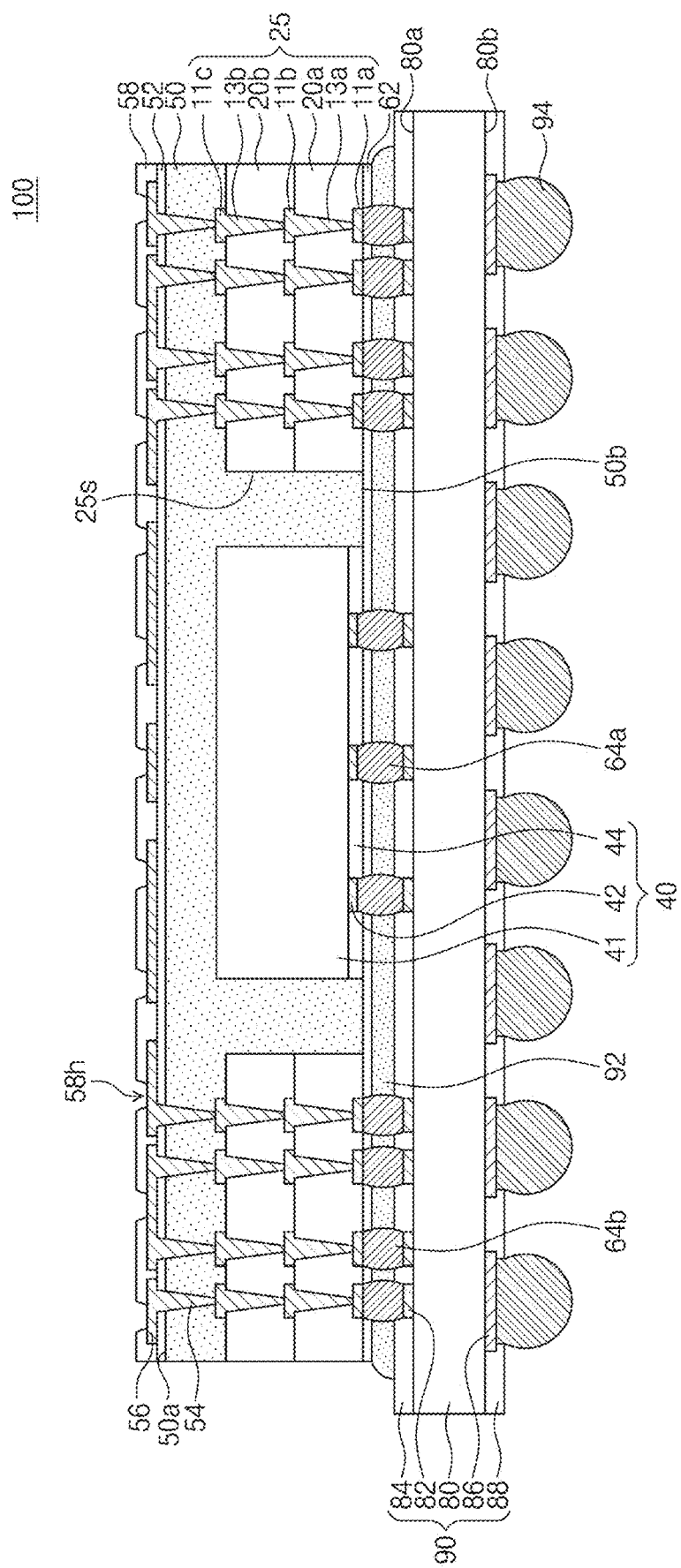
FIG. 2 is a sectional view taken along line II-II' of FIG. 1.

FIG. 1 is a plan view illustrating a semiconductor package according to an example embodiment of the inventive concepts. FIG. 2 is a sectional view taken along line II-II' of FIG. 1.

Referring to FIGS. 1 and 2, a semiconductor package 100 according to the present example embodiment may include a package substrate 90. A semiconductor chip 40 may be mounted on the package substrate 90 with a first connecting element 64a interposed therebetween. A connection substrate 25 may be provided on the package substrate 90 to enclose the semiconductor chip 40. The connection substrate 25 may be spaced apart from and surrounding the semiconductor chip 40. A second connecting element 64b may be interposed between the connection substrate 25 and the package substrate 90 to electrically connect the package substrate 90 to the connection substrate 25. The connection substrate 25 and the semiconductor chip 40 may be covered with a mold layer 50.

The package substrate 90 may include a substrate body 80, substrate upper conductive patterns 82, a substrate upper passivation layer 84, substrate lower conductive patterns 86, and a substrate lower passivation layer 88. The substrate body 80 may be formed of or include at least one of thermosetting resins (e.g., epoxy resin), thermoplastic resins (e.g., polyimide), composite materials (e.g., prepreg), in which a reinforcement element (e.g., glass fiber and/or inorganic filler) is pre-impregnated with a thermoplastic and/or thermosetting resin matrix, or photo-curable resins, but the inventive concepts are not limited thereto. The substrate body 80 may include a substrate top surface 80a and a substrate bottom surface 80b facing each other. The substrate upper conductive patterns 82 may be provided on the substrate top surface 80a. The substrate upper conductive patterns 82 and the substrate top surface 80a may be covered with the substrate upper passivation layer 84. The substrate lower conductive patterns 86 may be provided on the substrate bottom surface 80b. The substrate lower conductive patterns 86 and the substrate bottom surface 80b may be covered with the substrate lower passivation layer 88. The substrate upper conductive patterns 82 and the substrate lower conductive patterns 86 may be formed of or include at least one of aluminum, copper, gold, or titanium nitride, and may have a single- or multi-layered structure. Although not shown, a plurality of substrate penetration electrodes may be provided to penetrate the substrate body 80, and may be used to electrically connect the substrate upper conductive patterns 82 to the substrate lower conductive patterns 86. At least one of the substrate upper passivation layer 84 and the substrate lower passivation layer 88 may be a photosensitive solder resist (PSR) layer. The photosensitive solder resist layer may include a photosensitive polymer. The photosensitive polymer may include at least one of photosensitive polyimide (PSPI), polybenzoxazole (PBO), phenolic polymer, or benzocyclobutene polymer (BCB). The photosensitive solder resist may further include inorganic filler. The package substrate 90 may be a printed circuit board (PCB).

The semiconductor chip 40 may include at least one of a system large-scale integration (LSI) chip, a logic circuit chip, an image sensor chip (e.g., a CMOS imaging sensor (CIS)), a memory chip (e.g., FLASH memory, DRAM, SRAM, EEPROM, PRAM, MRAM, ReRAM, high bandwidth memory (HBM), or hybrid memory cubic (HMC)), or a microelectromechanical system (MEMS) device. The semiconductor chip 40 may include a chip main part 41, chip conductive pads 42 provided on a bottom surface of the chip main part 41, and a chip passivation layer 44 covering the bottom surface of the chip main part 41. The chip main part 41 may include a semiconductor substrate, transistors formed on the semiconductor substrate, interlayer insulating layers covering them, and interconnection lines provided between the interlayer insulating layers. The chip conductive pads 42 may be provided on the topmost one of the interlayer insulating layers and may be electrically connected to an internal interconnection line provided in the chip main part 41. The chip conductive pads 42 may be formed of or include at least one of aluminum, copper, gold, tin, or titanium nitride, and may have a single- or multi-layered structure. The chip passivation layer 44 may cover the topmost one of the interlayer insulating layers. The chip passivation layer 44 may be formed of or include at least one of, for example, silicon oxide, silicon nitride, silicon oxynitride, tetraethyl orthosilicate (TEOS), or polyimide, and may have a single or multi-layered structure.

Referring to FIGS. 1 and 2, the connection substrate 25 may be spaced apart from the semiconductor chip 40, and may include or define a rectangular hollow cavity structure surrounding the semiconductor chip 40. The connection substrate 25 may include a first connection insulating layer 20a and a second connection insulating layer 20b, which are sequentially stacked. Each of the first connection insulating layer 20a and the second connection insulating layer 20b may be formed of or include an insulating material. The insulating material may include thermosetting resins (e.g., epoxy resin), thermoplastic resins (e.g., polyimide), or composite resins (e.g., prepreg, Ajinomoto build-up film (ABF), and bismaleimide triazine (BT)), in which a thermosetting resin and/or a thermoplastic resin is impregnated together with an inorganic filler in a core material such as a glass fiber (e.g., a glass cloth or a glass fabric). In some example embodiments, a photo-imageable dielectric (PID) resin may be used as the insulating material. The connection substrate 25 may include first, second, and third connection conductive patterns 11a, 11b, and 11c and first and second connection vias 13a and 13b. The first connection conductive patterns 11a may be provided in the first connection insulating layer 20a to be adjacent to a bottom surface of the first connection insulating layer 20a. In some example embodiments, the bottom surface of the first connection insulating layer 20a may be coplanar with bottom surfaces of the first connection conductive patterns 11a. The bottom surfaces of the first connection conductive patterns 11a may be exposed to the outside. One of the first connection vias 13a and one of the second connection conductive patterns 11b may be connected to each other, thereby forming a single body structure (interchangeably referred to as a single integrated structure). The first connection via 13a may be formed to penetrate the first connection insulating layer 20a and to contact the first connection conductive pattern 11a. The second connection conductive pattern 11b may be interposed between the first connection insulating layer 20a and the second connection insulating layer 20b. One of the second connection vias 13b and one of the third connection conductive patterns 11c may be connected to each other, thereby forming a single body structure. The second connection via 13b may penetrate the second connection insulating layer 20b and to contact the second connection conductive pattern 11b. The third connection conductive pattern 11c may be interposed between the second connection insulating layer 20b and the mold layer 50. The connection substrate 25 may also be referred to as a connection member. The connection substrate 25 may be a printed circuit board, in which a cavity 25s is formed.

The connection substrate 25 may include a plurality of conductive connection structures penetrating therethrough. The connection substrate 25 may be provided on the package substrate 90 to be spaced apart from and surround the semiconductor chip 40. In some example embodiments, the connection substrate 25 may include two or more insulating layers 20a and 20b that are sequentially stacked, and a plurality of conductive structures each including at least two or more connection via portions 13a and 13b and two or more connection conductive pattern portions 11a, 11b, and 11c that are electrically connected to each other, the two or more connection via portions penetrating corresponding ones of the two or more insulating layers 20a and 20b, respectively, the two or more connection conductive pattern portions 11a, 11b, and 11c on corresponding ones of the two or more insulating layers 20a and 20b, respectively. The lowermost one of the two or more connection conductive pattern portions 11a, 11b, and 11c may be exposed by the lowermost one of the two or more insulating layers 20a and 20b. The lowermost one of the two or more connection conductive pattern portions 11a, 11b, and 11c may be electrically connected to the package substrate 90 via a corresponding one of the plurality of second connecting elements 64b. A bottom surface of the lowermost one of the two or more connection conductive pattern portions 11a, 11b, and 11c may be coplanar with a bottom surface of a lowermost one of the two or more insulating layers 20a and 20b.

The mold layer 50 may encapsulate the semiconductor chip 40 and the connection substrate 25. The mold layer 50 may include a mold bottom surface 50b adjacent to the package substrate 90 and a mold top surface 50a facing the mold bottom surface 50b. The mold layer 50 may be formed of or include an insulating resin (e.g., epoxy molding compound (EMC)). The mold layer 50 may further include fillers, which are distributed in the insulating resin. The filler may be formed of or include, for example, silicon oxide ($SiO_2$). The mold layer 50 may fill a space between the semiconductor chip 40 and the connection substrate 25. The mold layer 50 may contact a side surface of the cavity 25s. The mold bottom surface 50b may be substantially coplanar with a bottom surface of the first connection insulating layer 20a of the connection substrate 25. The mold bottom surface 50b may be coplanar with a bottom surface of the chip passivation layer 44. The mold bottom surface 50b, the bottom surface of the chip passivation layer 44, and the bottom surface of the first connection insulating layer 20a may be covered with a lower insulating layer 62. The lower insulating layer 62 may be provided between the semiconductor chip 40 and an under-fill layer 92 and between the connection substrate 25 and the under-fill layer 92. The plurality of first connecting elements 64a and the plurality of second connecting elements 64b penetrate through the lower insulating layer 62 and the under-fill layer 92. The lower insulating layer 62 may be formed of or include, for example, a thermosetting resin or epoxy. The lower insulating layer 62 may be formed of or include, for example, Ajinomoto Build-up Film (ABF). The mold bottom surface 50b may be spaced apart from the package substrate 90.

The plurality of second connecting elements 64b may be between the connection substrate 25 and the package substrate 90, and electrically connect the connection substrate 25 to the package substrate 90. Each of the first connecting elements 64a and the second connecting elements 64b may include at least one of a solder ball, a conductive bump, or a conductive pillar. The first connecting elements 64a and the second connecting elements 64b may be formed of or include at least one of tin, lead, copper, aluminum, or gold. The first connecting elements 64*a* may penetrate the lower insulating layer 62, the chip passivation layer 44, and the substrate upper passivation layer 84, and may be used to electrically connect the chip conductive pads 42 to some (e.g., corresponding ones) of the substrate upper conductive patterns 82. The second connecting elements 64*b* may penetrate the lower insulating layer 62 and the substrate upper passivation layer 84, and may be used to electrically connect the first connection conductive patterns 11*a* to some others (e.g., corresponding ones) of the substrate upper conductive patterns 82.

A distance between the first connecting elements 64*a* or a distance between the second connecting elements 64*b* may range from 100 μm to 200 μm. The first connecting elements 64*a* or the second connecting elements 64*b* may have a height ranging from 50 μm to 100 μm.

The under-fill layer 92 may be interposed between the lower insulating layer 62 and the package substrate 90. The under-fill layer 92 may be provided between the package substrate 90 and the semiconductor chip 40 and between the package substrate 90 and the connection substrate 25. The under-fill layer 92 may include at least one of thermosetting resins or photo-curable resins. In some example embodiments, the under-fill layer 92 may further include at least one of organic fillers or inorganic fillers. The under-fill layer 92 may fill a space between the first connecting elements 64*a* and the second connecting elements 64*b*. A distance between the semiconductor chip 40 and the package substrate 90 may range from 50 μm to 100 μm.

In some example embodiments, each or all of the lower insulating layer 62, the mold layer 50, the under-fill layer 92, and the substrate body 80 may be formed of or include at least one of thermosetting resins or epoxy. However, there may be a difference in contents and/or kinds of the thermosetting resin and/or epoxy contained therein. The mold layer 50, the under-fill layer 92, and the substrate body 80 may further include fillers. However, there may be a difference in sizes or kinds of the fillers contained therein.

A first upper insulating layer 52 may be provided on the mold top surface 50*a*. Redistribution patterns 56 may be provided on the first upper insulating layer 52. Redistribution vias 54 may penetrate the first upper insulating layer 52 and the mold layer 50, and may be used to electrically connect the redistribution patterns 56 to the third connection conductive patterns 11*c*. One of the redistribution patterns 56 and corresponding one of the redistribution vias 54 may be connected to each other, thereby forming a single body structure. The redistribution patterns 56 may constitute a re-distribution layer. The redistribution patterns 56 may be covered with a second upper insulating layer 58. The first upper insulating layer 52 and the second upper insulating layer 58 may independently include at least one of thermosetting resins (e.g., epoxy resin), thermoplastic resins (e.g., polyimide), ABF, or Photo-Imageable Dielectric (PID) resin. The second upper insulating layer 58 may have openings 58*h* exposing some of the redistribution patterns 56.

In other words, an upper redistribution pattern may be provide on the mold layer 50 and the semiconductor chip 40, and may include a redistribution via portion 54 and a redistribution conductive pattern portion 56. The redistribution via portion 54 may penetrate the mold layer 50 and be electrically connected to a corresponding one of the plurality of conductive structures. The redistribution conductive pattern portion 56 may be on the mold layer 50 and connected to the redistribution via portion 54.

For example, the second upper insulating layer 58 may be formed of or include the same material as the lower insulating layer 62. The lower insulating layer 62 and the second upper insulating layer 58 may be formed of or include, for example, ABF. The first upper insulating layer 52 may be formed of or include a PID resin.

Outer terminals (or alternatively, external connection terminals) 94 may be attached to the substrate lower conductive patterns 86 of the package substrate 90. The outer terminals 94 may be solder balls. The outer terminals 94 may be formed of or include tin and lead. In the present example embodiment, the semiconductor package 100 may have a modified fan-out wafer level package (FOWLP) structure. A pitch between the plurality of second connecting elements 64*b* may be less than a pitch between the outer terminals 94.

In the semiconductor package 100 according to the present example embodiment, the semiconductor chip 40 may be electrically connected to the connection substrate 25 through the package substrate 90 without an additional multi-layered re-distribution structure provided below the semiconductor chip 40. Because, a process of forming a multi-layered re-distribution structure in a preliminary structure including the semiconductor chip 40, the connection substrate 25, and the mold layer 50 may be omitted by using the package substrate 90, an overall process time may be reduced and/or a fabrication yield may be increased.

Figure 3:
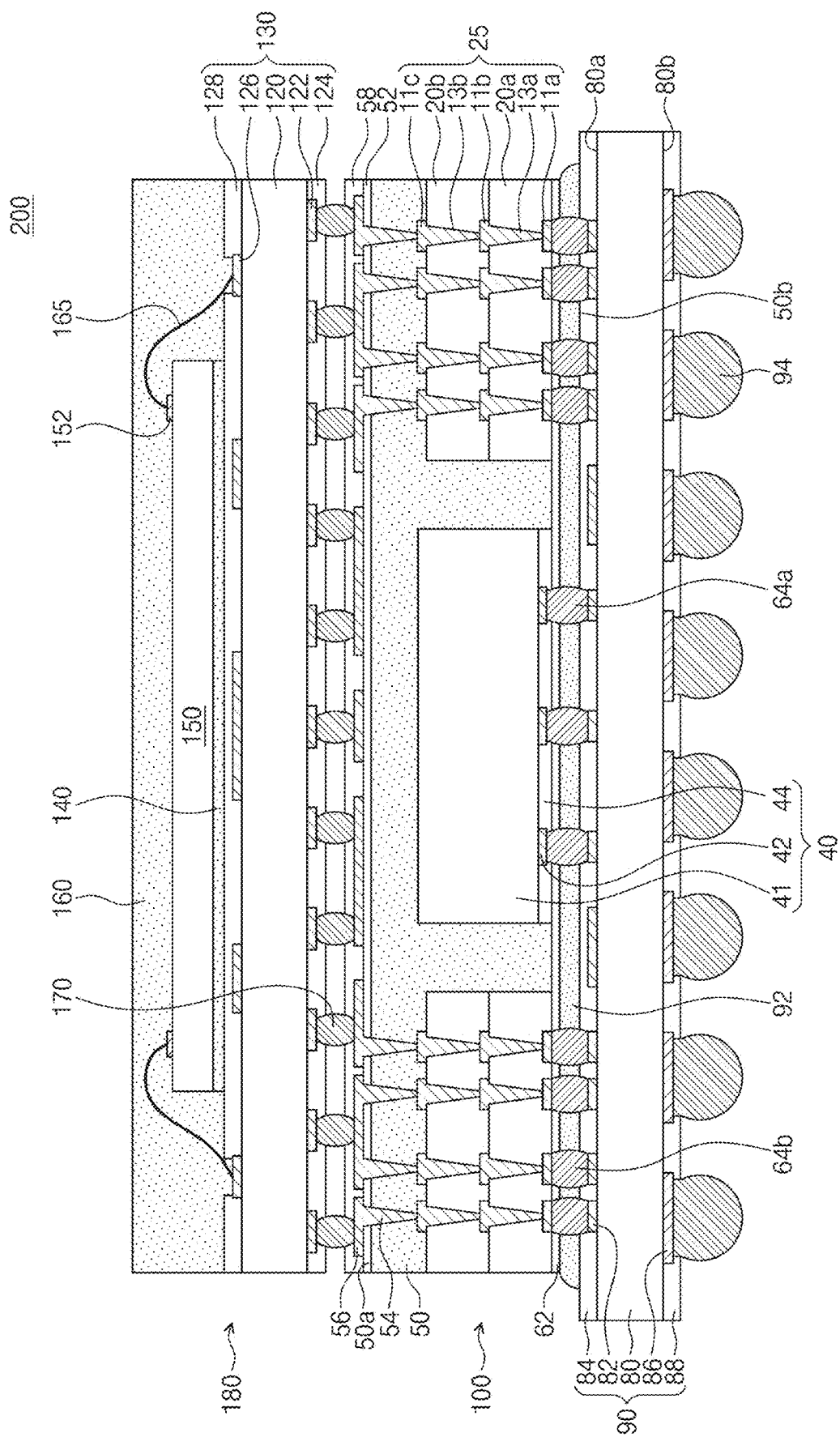
FIG. 3 is a sectional view illustrating a package-on-package device according to an example embodiment of the inventive concepts.

FIG. 3 is a sectional view illustrating a package-on-package device according to an example embodiment of the inventive concepts.

Referring to FIG. 3, in a package-on-package device 200 according to the present example embodiment, a second semiconductor package 180 may be mounted on a first semiconductor package 100. The first semiconductor package 100 may have the same or substantially similar structure as the semiconductor package 100 described with reference to FIGS. 1 and 2.

The second semiconductor package 180 may include a second package substrate 130, a second semiconductor chip 150, which is attached to the second package substrate 130 by an adhesive layer 140 interposed therebetween, and a second mold layer 160, which is provided to cover the second semiconductor chip 150 and the second package substrate 130. The second semiconductor package 180 may be provided on the upper redistribution pattern 56, and may be electrically connected to the redistribution conductive pattern portion of the upper redistribution pattern 56. The second package substrate 130 may include a second substrate body 120, second substrate upper conductive patterns 126, a second substrate upper passivation layer 128, second substrate lower conductive patterns 122, and a second substrate lower passivation layer 124. Second chip conductive pads 152 may be provided on the second semiconductor chip 150. The second chip conductive pads 152 may be connected to some of the second substrate upper conductive patterns 126 through wires 165. The second semiconductor chip 150 may include at least one of a system large-scale integration (LSI) chip, a logic circuit chip, an image sensor chip (e.g., CMOS imaging sensor (CIS)), a memory chip (e.g., FLASH memory, DRAM, SRAM, EEPROM, PRAM, MRAM, ReRAM, high bandwidth memory (HBM), or hybrid memory cubic (HMC)), or a microelectromechanical system (MEMS) device.

The first semiconductor package 100 may be electrically connected to the second semiconductor package 180 through package connecting elements 170. Each of the package connecting elements 170 may be or include at least one of a solder ball, a conductive bump, or a conductive pillar. The package connecting elements 170 may be formed of or include at least one of tin or lead. The package connecting elements 170 may connect the second substrate lower conductive patterns 122 to the redistribution patterns 56 exposed through the openings 58h of the second upper insulating layer 58. A pitch between the plurality of second connecting elements 64b may be less than a pitch between the package connecting elements 170.

FIGS. 4A, 4B, 4C, 4D, 4E, 4F, 4G, 4H, 4I, 4J, 4K, 4L, 4M, 4N, 4O, and 4P are sectional views sequentially illustrating a process of fabricating the semiconductor package of FIG. 2.

Figure 4A:
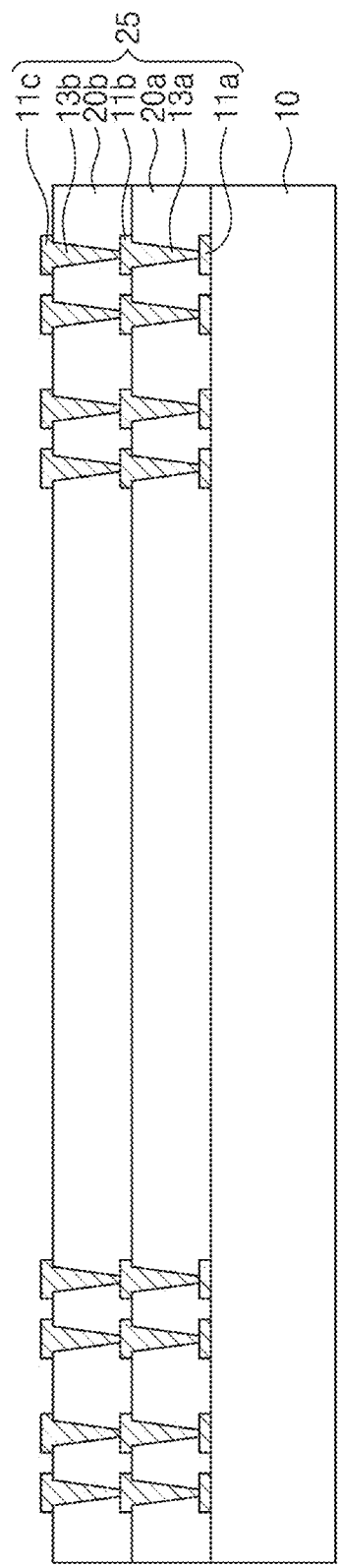

Referring to FIG. 4A, a first sacrificial substrate 10 may be prepared. The first sacrificial substrate 10 may be, for example, a tape. A deposition process and an etching process may be performed to form the first connection conductive patterns 11a on the first sacrificial substrate 10. The first connection insulating layer 20a may be formed on the first sacrificial substrate 10 with the first connection conductive patterns 11a. In some example embodiments, a mechanical and/or laser drilling process may be performed to remove some portions of the first connection insulating layer 20a to form first connection via holes, through which the first connection conductive patterns 11a are exposed. A conductive layer may be formed on the first connection insulating layer 20a to fill the first connection via holes, and patterned to form the first connection vias 13a and the second connection conductive patterns 11b. The second connection insulating layer 20b may be formed on the first connection insulating layer 20a. In some example embodiments, a mechanical and/or laser drilling process may be performed to remove portions of the second connection insulating layer 20b to form second connection via holes, through which the second connection conductive patterns 11b are exposed. A conductive layer may be formed on the second connection insulating layer 20b to fill the second via holes, and then patterned to form the second connection vias 13b and the third connection conductive patterns 11c. The first, second, and third connection conductive patterns 11a, 11b, and 11c and the first and second connection vias 13a and 13b may be formed in edge regions of the first and second connection insulating layers 20a and 20b. Each of the first connection insulating layer 20a and the second connection insulating layer 20b may be formed of or include an insulating material. The insulating material may include thermosetting resins (e.g., epoxy resin), thermoplastic resins (e.g., polyimide), or composite resins (e.g., prepreg, ABF or bismaleimide triazine (BT)), in which a thermosetting or thermoplastic resin and an inorganic filler are pre-impregnated with a glass fiber material (e.g., glass fiber, glass cloth, or glass fabric). In some example embodiments, the insulating material may include a PID resin.

Figure 4B:
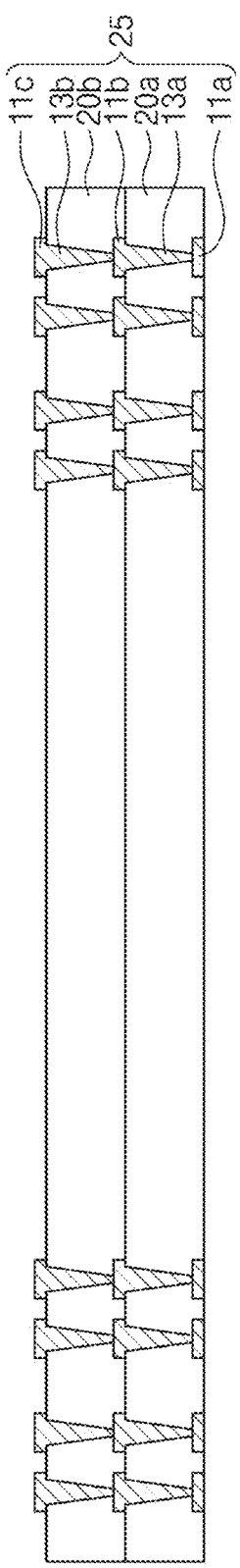
Figure 4C:
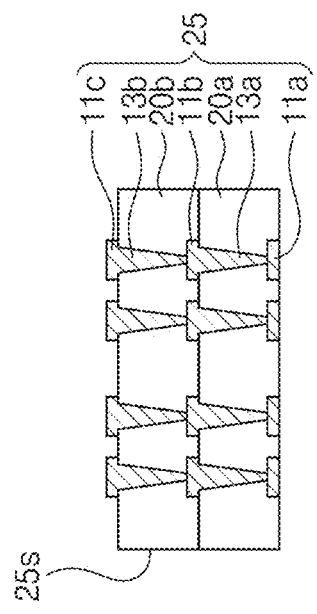

Referring to FIGS. 4B and 4C, the first sacrificial substrate 10 may be removed to expose bottom surfaces of the first connection insulating layer 20a and the first connection conductive patterns 11a. Center regions of the first and second connection insulating layers 20a and 20b may be removed by, for example, a mechanical and/or laser drilling process such that the connection substrate 25 includes the cavity 25s.

Figure 4D:
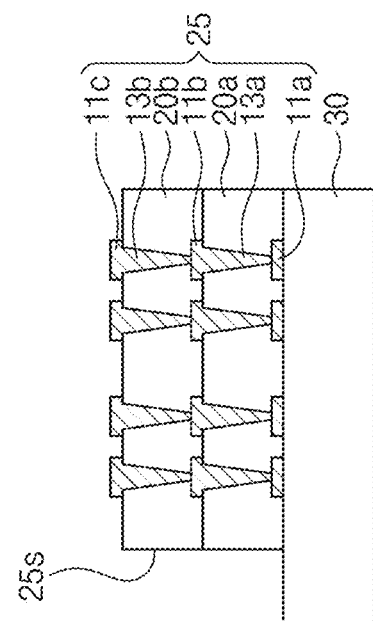

Referring to FIG. 4D, a second sacrificial substrate 30 may be prepared. The second sacrificial substrate 30 may be, for example, a single sided tape. The connection substrate 25 with the cavity 25s may be attached to the second sacrificial substrate 30. Here, the bottom surfaces of the first connection conductive patterns 11a and the first connection insulating layer 20a may contact the second sacrificial substrate 30.

Figure 4E:
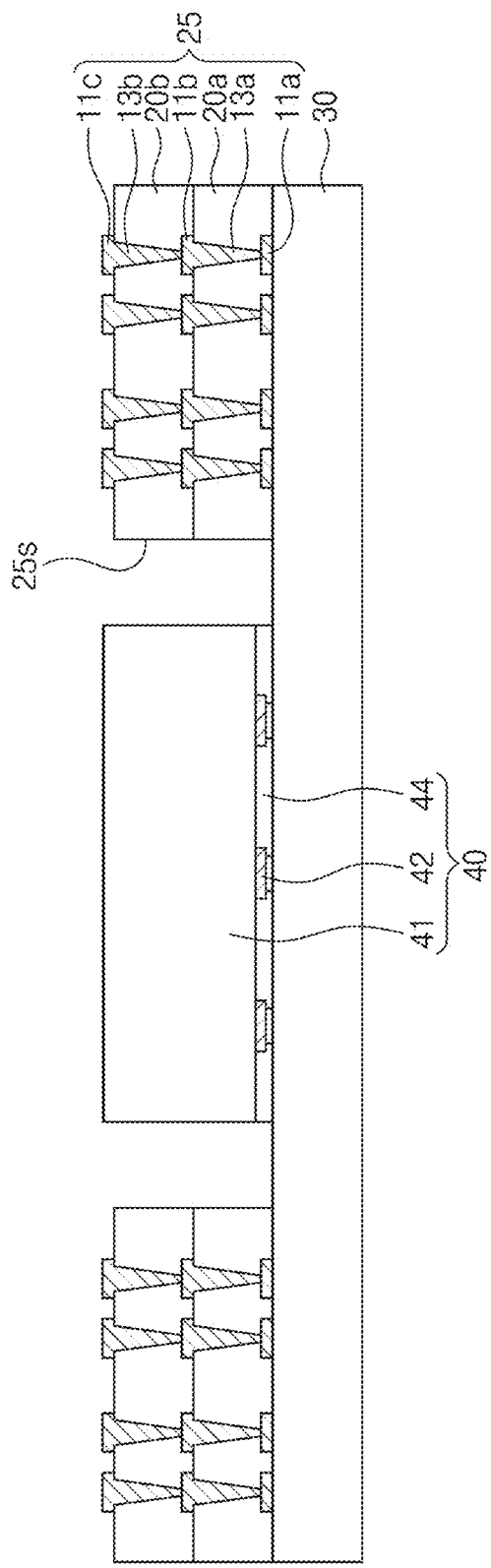

Referring to FIG. 4E, the semiconductor chip 40 may be attached to the second sacrificial substrate 30. The semiconductor chip 40 may be inserted into the cavity 25s of the connection substrate 25. The semiconductor chip 40 may include the chip main part 41, the chip conductive pads 42, and the chip passivation layer 44. The chip passivation layer 44 may contact the second sacrificial substrate 30.

Figure 4F:
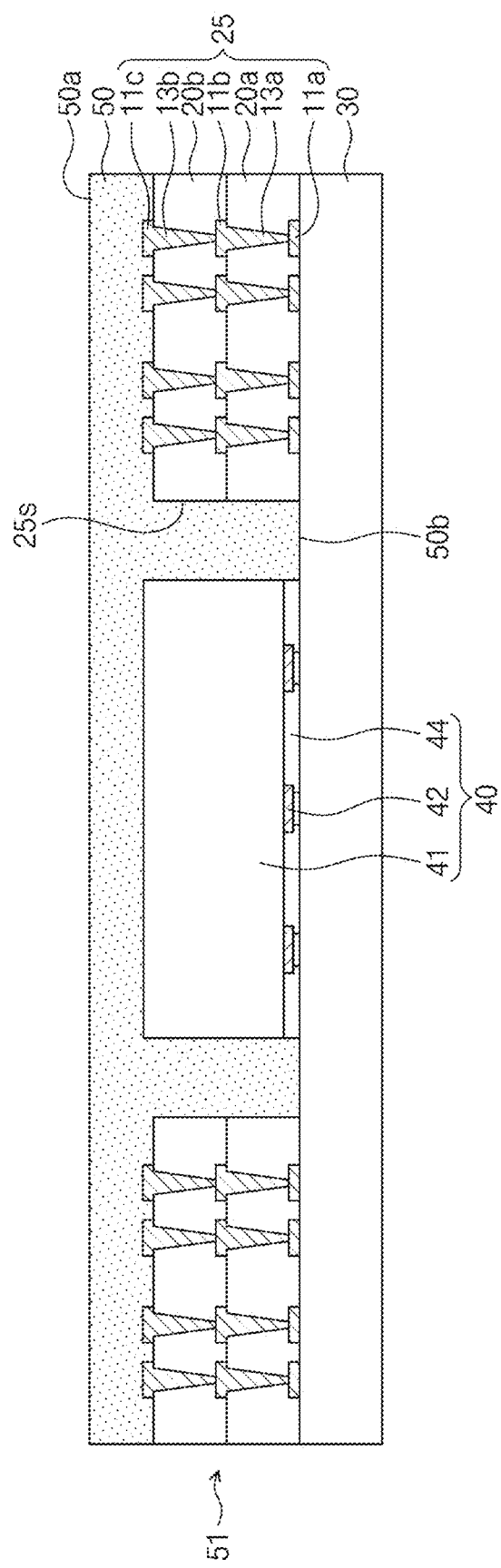

Referring to FIG. 4F, the mold layer 50 may be formed on the second sacrificial substrate 30 to cover the connection substrate 25 and the semiconductor chip 40. The mold layer 50 may fill a space between the connection substrate 25 and the semiconductor chip 40. The mold layer 50 may include the mold top surface 50a and the mold bottom surface 50b. The mold layer 50 may be formed of an insulating resin (e.g., an epoxy molding compound (EMC)), in which fillers are contained or dispersed. The mold bottom surface 50b may contact the second sacrificial substrate 30. Hereinafter, a structure including the semiconductor chip 40, the connection substrate 25, and the mold layer 50 will be referred to as a preliminary structure 51.

Figure 4G:
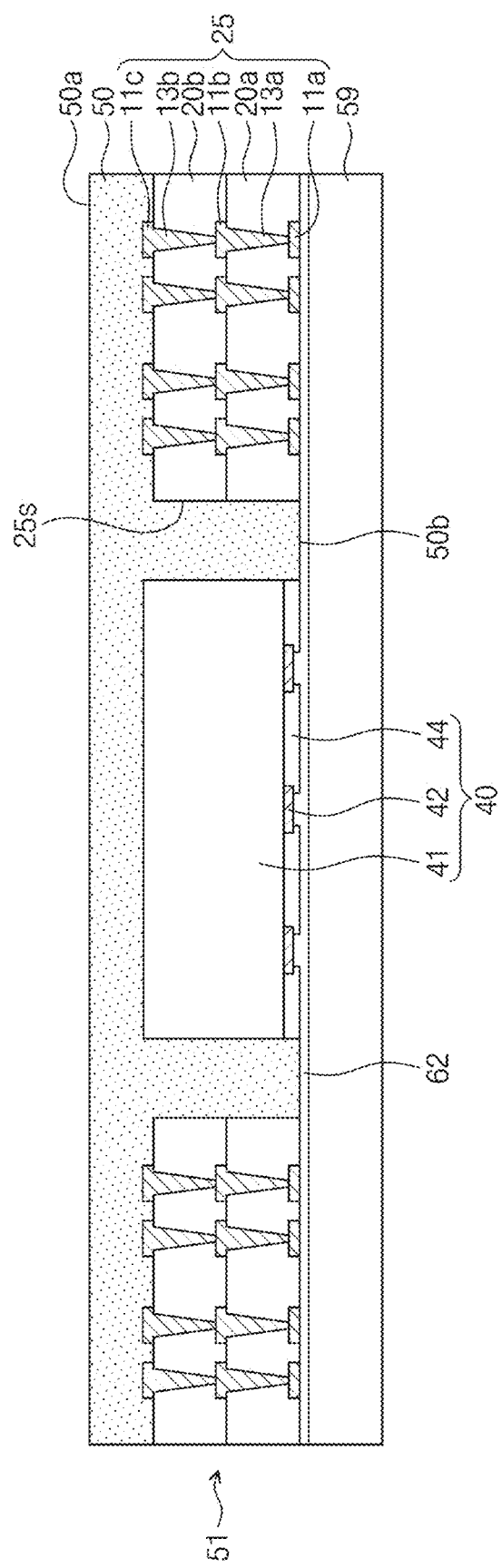

Referring to FIGS. 4F and 4G, the second sacrificial substrate 30 may be removed from the preliminary structure 51 to expose the mold bottom surface 50b, the first connection insulating layer 20a, and the chip passivation layer 44. Thereafter, the preliminary structure 51 may be attached to a first carrier substrate 59 with the lower insulating layer 62 interposed therebetween. The lower insulating layer 62 may be formed of or include at least one of thermosetting resins or ABF. The lower insulating layer 62 may be used as an adhesive layer. Subsequently, the lower insulating layer 62 may be heated and hardened.

Figure 4H:
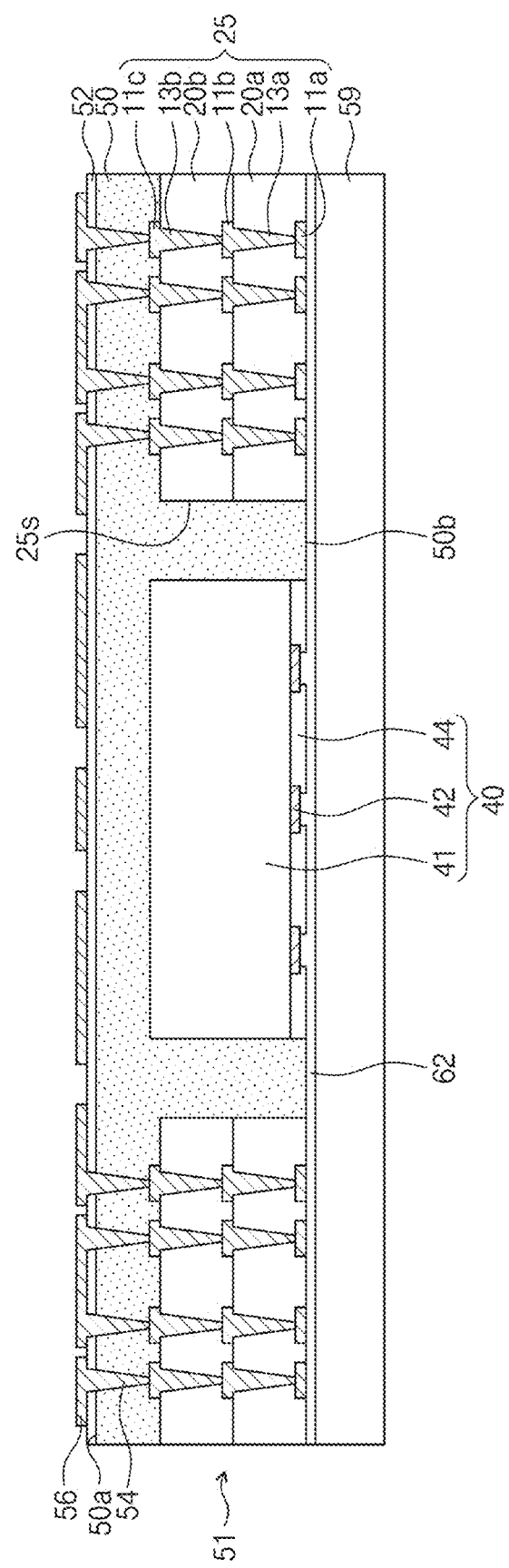

Referring to FIG. 4H, the first upper insulating layer 52 may be formed on the mold top surface 50a. The first upper insulating layer 52 may be formed of or include at least one of thermosetting resins (e.g., epoxy resin), thermoplastic resins (e.g., polyimide), ABF, or PID resins. A redistribution via hole may be formed in the first upper insulating layer 52 and the mold layer 50 using, for example, a laser drilling process to expose the third connection conductive pattern 11c. A conductive layer may be formed on the first upper insulating layer 52 and then may be patterned to form the redistribution vias 54 filling the redistribution via holes and the redistribution patterns 56.

Figure 4I:
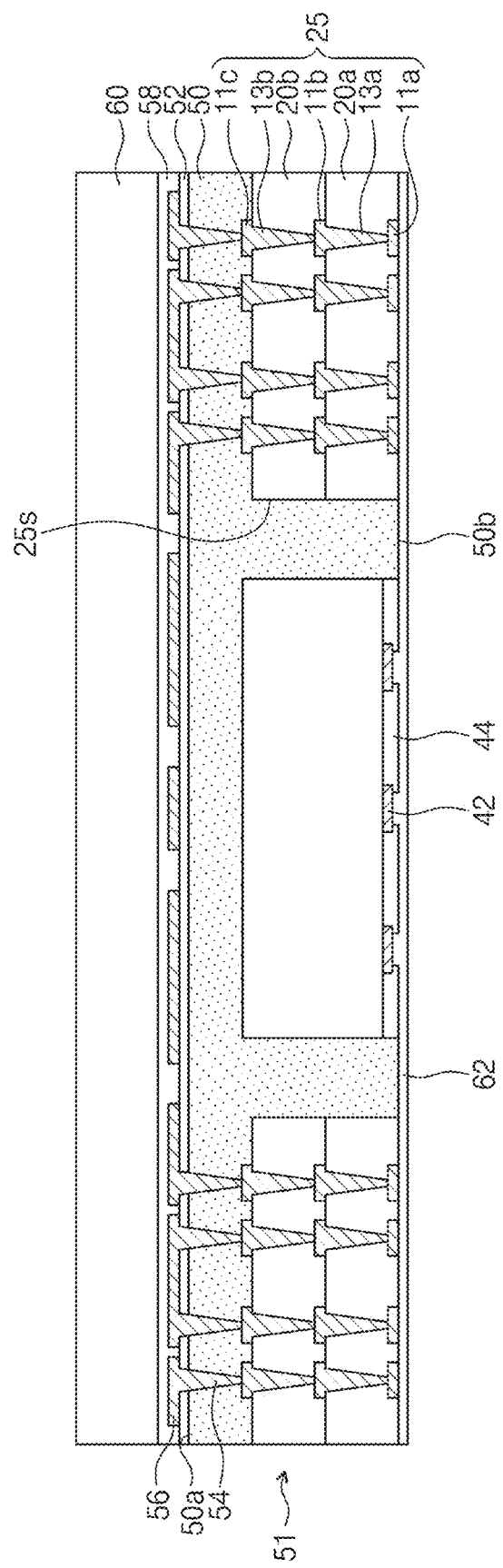

Referring to FIG. 4I, the first carrier substrate 59 may be detached or removed from the lower insulating layer 62 using, for example, a physical force, which is exerted at an interface between the first carrier substrate 59 and the lower insulating layer 62. The second carrier substrate 60 may be attached to the redistribution patterns 56 by the second upper insulating layer 58 interposed therebetween. The second upper insulating layer 58 may be formed of or include at least one of thermosetting resins (e.g., epoxy resin), thermoplastic resins (e.g., polyimide), ABF, or PID resins. The second upper insulating layer 58 may be used not only as an adhesive layer, but also as a passivation layer covering the redistribution patterns 56. Subsequently, the second upper insulating layer 58 may be heated and hardened.

Figure 4J:
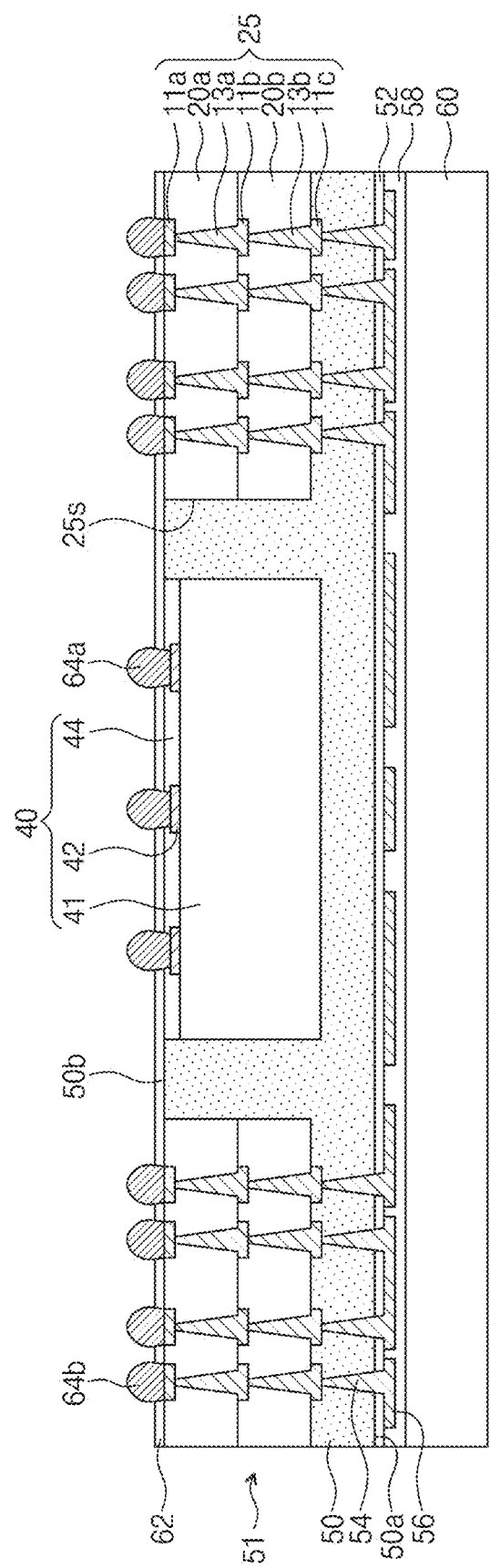

Referring to FIG. 4J, the preliminary structure 51 of FIG. 4I may be inverted (e.g., may be flipped upside down). Next, the lower insulating layer 62 may be patterned using, for example, a laser drilling process to form openings, through which the first connection conductive patterns 11a and the chip conductive pads 42 are exposed. The first connecting elements 64a and the second connecting elements 64b may be bonded on the chip conductive pads 42 and the first connection conductive patterns 11*a*, respectively. During the bonding process, the openings defined through the lower insulating layer 62 may be used to guide the first and second connecting elements 64*a* and 64*b*. Thus, a bridge may be mitigated or prevented from occurring between adjacent ones of the first and second connecting elements 64*a* and 64*b*. Each of the first and second connecting elements 64*a* and 64*b* may be formed of or include at least one of a solder ball, a conductive bump, or a conductive pillar. The first connecting elements 64*a* and the second connecting elements 64*b* may be formed of or include at least one of tin, lead, copper, aluminum, or gold.

Figure 4L:
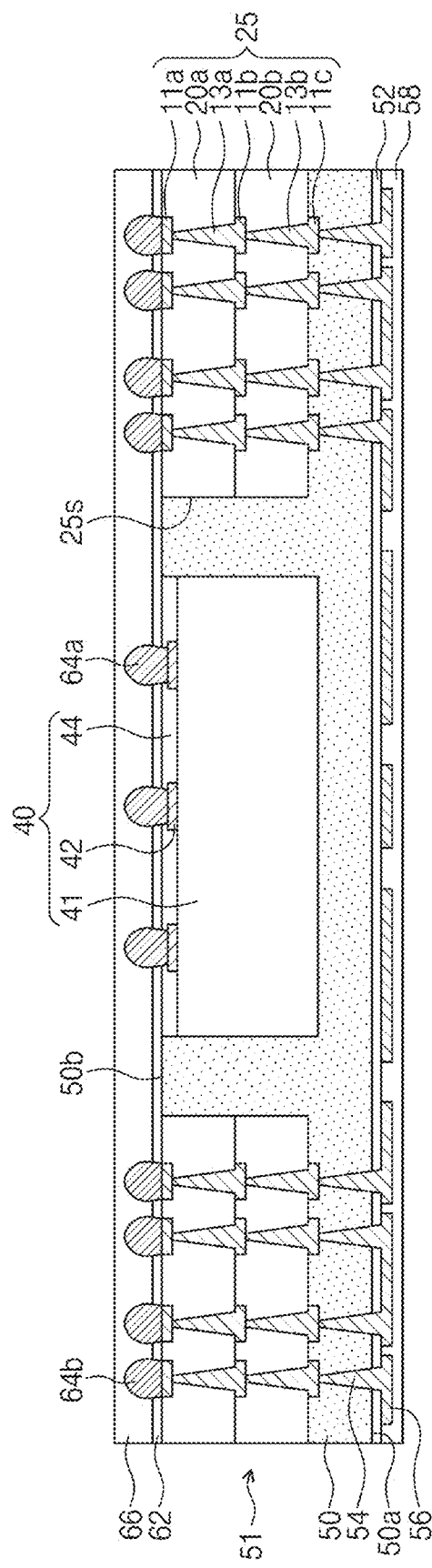

Referring to FIGS. 4K and 4L, a protection layer 66 may cover the first and second connecting elements 64*a* and 64*b*. The protection layer 66 may be, for example, a single sided tape. The protection layer 66 may prevent the first and second connecting elements 64*a* and 64*b* from being damaged in a subsequent process. After the formation of the protection layer 66, the second carrier substrate 60 may be separated from the second upper insulating layer 58 to expose the second upper insulating layer 58.

Figure 4M:
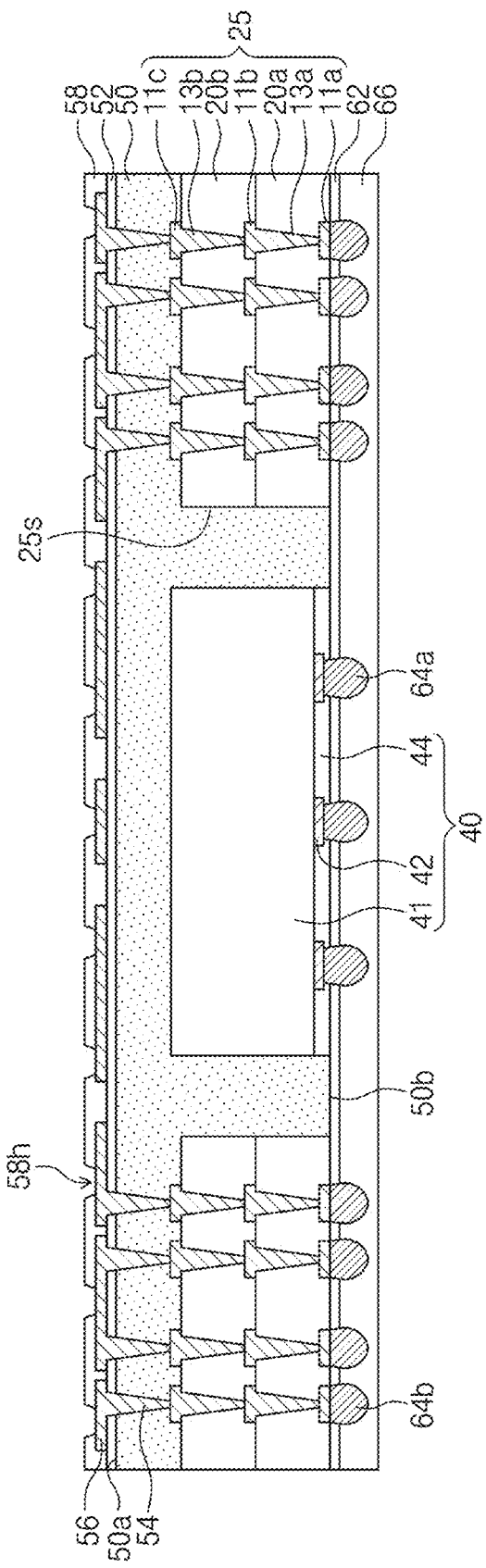

Referring to FIG. 4M, the preliminary structure 51 of FIG. 4L may be inverted (e.g., may be flipped upside down). Thereafter, the second upper insulating layer 58 may be patterned using, for example, a laser drilling process to form the openings 58*h*, through which the redistribution patterns 56 are exposed.

Figure 4N:
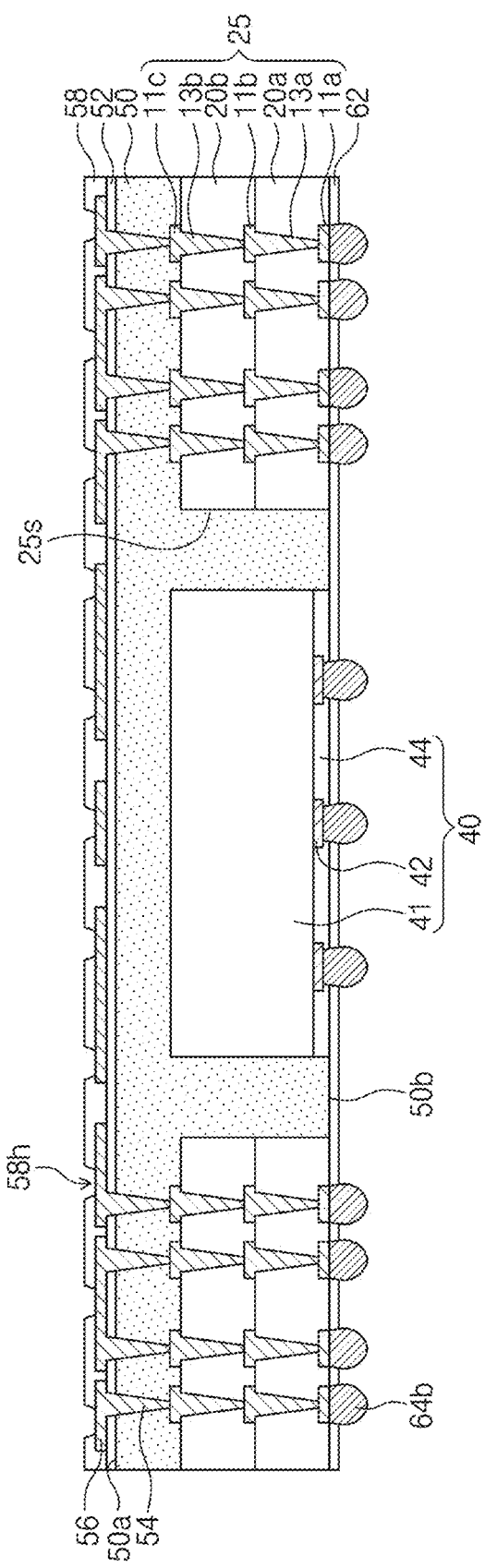

Referring to FIGS. 4N and 4O, the protection layer 66 may be removed to expose the lower insulating layer 62 and the first and second connecting elements 64*a* and 64*b*. The package substrate 90 may be prepared. The package substrate 90 may include the substrate body 80, the substrate upper conductive patterns 82, the substrate upper passivation layer 84, the substrate lower conductive patterns 86, and the substrate lower passivation layer 88. The preliminary structure 51 of FIG. 4N may be placed on the package substrate 90, and may be heated to bond the first and second connecting elements 64*a* and 64*b* to the substrate upper conductive patterns 82.

Figure 4P:
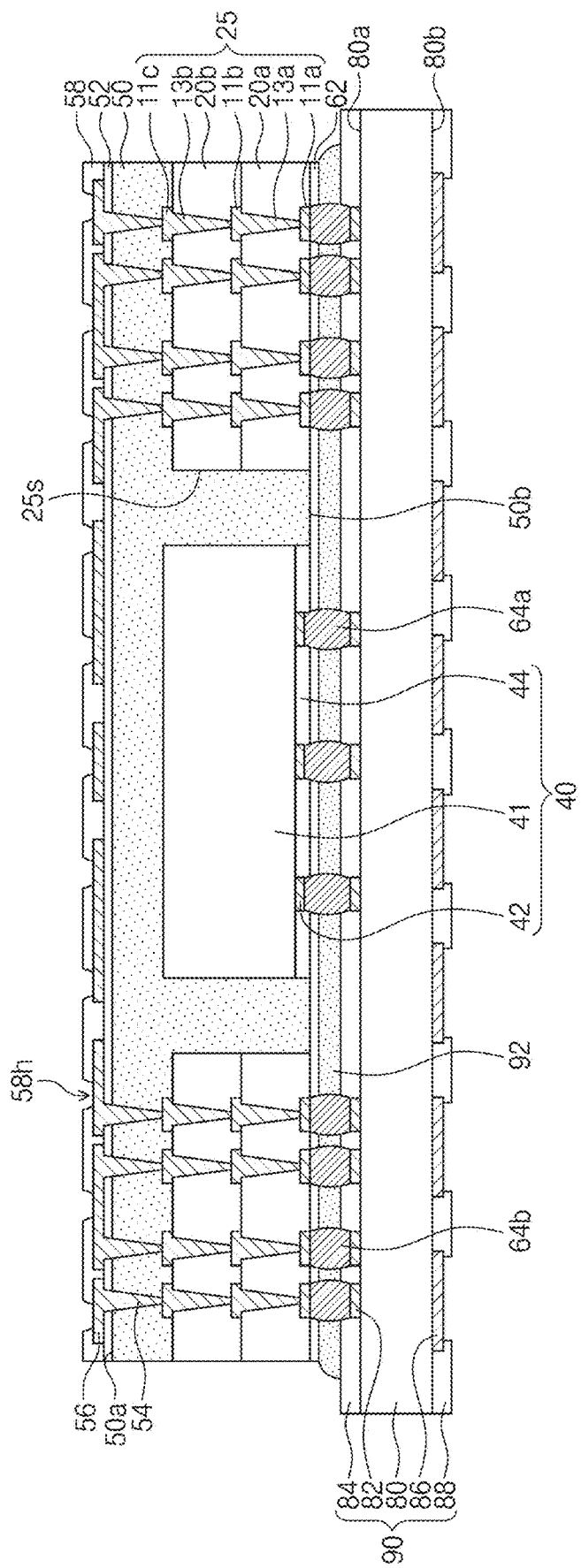

Referring to FIG. 4P, the under-fill layer 92 may be formed between the lower insulating layer 62 and the package substrate 90. Referring to FIG. 2, the outer terminals 94 (e.g., solder balls) may be bonded to the substrate lower conductive patterns 86. Thereafter, a singulation process and a sorting process may be performed. Thus, the semiconductor package 100 may be fabricated to have the structure of FIG. 2.

In the fabrication method according to some example embodiments of the inventive concepts, the package substrate 90 may be used to connect the semiconductor chip 40 to the connection substrate 25 without an additional multi-layered re-distribution structure provided below the semiconductor chip 40. Because a process of forming a multi-layered re-distribution structure in the preliminary structure including the semiconductor chip 40, the connection substrate 25, and the mold layer 50 may be omitted by using the package substrate 90 may be omitted and the package substrate 90 can be separately fabricated and provided when forming the semiconductor package 100, an overall process time may be reduced and/or a fabrication yield may be increased.

Figure 5:
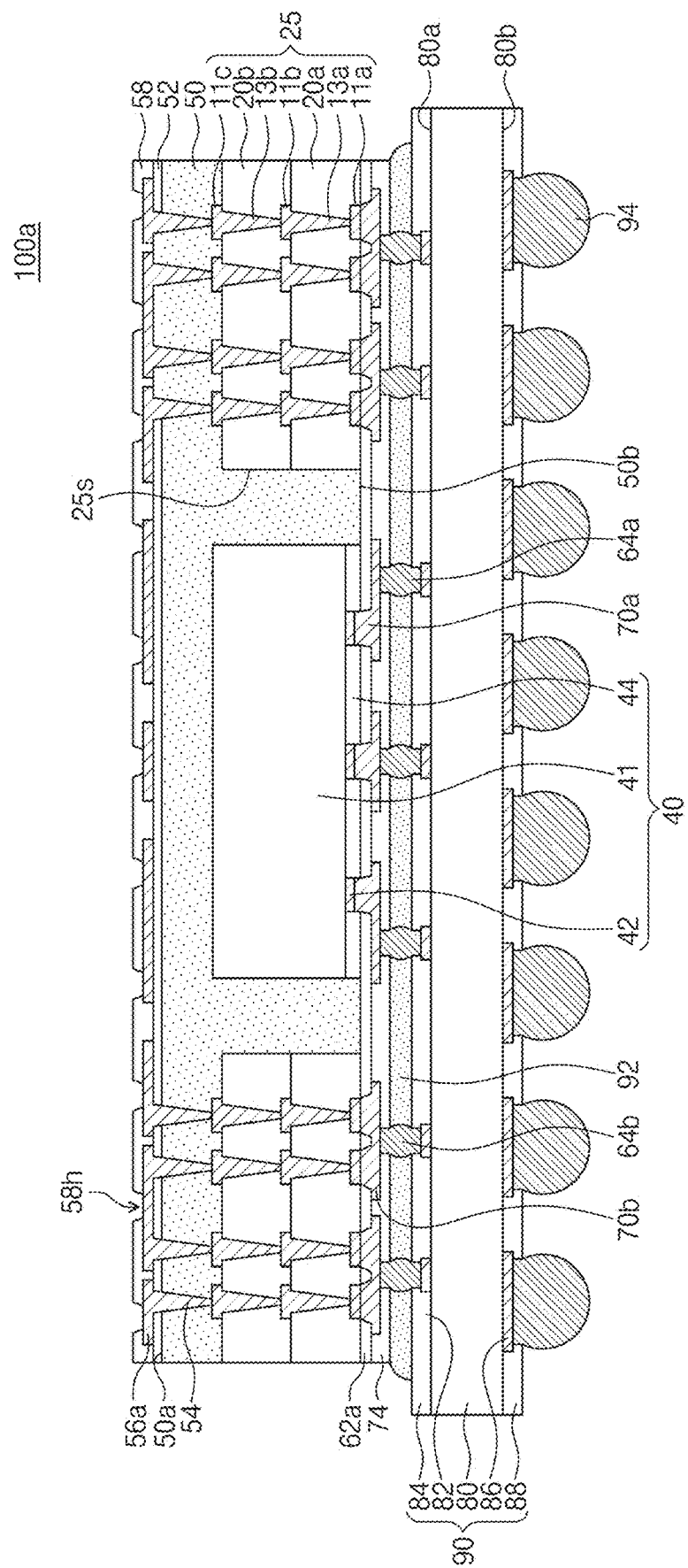
FIG. 5 is a sectional view illustrating a semiconductor package according to an example embodiment of the inventive concepts.

FIG. 5 is a sectional view illustrating a semiconductor package according to an example embodiment of the inventive concepts.

Referring to FIG. 5, in a semiconductor package 100*a* according to the present example embodiment, a first lower insulating layer 62*a* may be provided below the mold bottom surface 50*b*. A second lower insulating layer 74 may be provided below the first lower insulating layer 62*a*. The second lower insulating layer 74 may be provided between the first lower insulating layer 62*a* and the mold layer 50. The first lower insulating layer 62*a* may be formed of or include, for example, ABF. The second lower insulating layer 74 may be formed of or include at least one of thermosetting resins (e.g., epoxy resin), thermoplastic resins (e.g., polyimide), ABF, or PID resins.

Lower redistribution patterns 70*a* and 70*b* may be interposed between the first lower insulating layer 62*a* and the second lower insulating layer 74. The lower redistribution patterns 70*a* and 70*b* may include a first lower redistribution pattern 70*a* and a second lower redistribution pattern 70*b*. The first lower redistribution pattern 70*a* may penetrate the first lower insulating layer 62*a* and contact the chip conductive pad 42. The second lower redistribution pattern 70*b* may penetrate the first lower insulating layer 62*a* and contact the first connection conductive pattern 11*a*. The first and second lower redistribution patterns 70*a* and 70*b* may constitute a single-layered lower re-distribution layer. Some of the first and second lower redistribution patterns 70*a* and 70*b* may be connected to each other.

In other words, a first lower redistribution pattern 70*a* may include a redistribution conductive pattern portion and a redistribution via portion connected to the redistribution conductive pattern portion. The redistribution conductive pattern portion of the first lower redistribution pattern 70*a* may be provided between the first lower insulating layer 62*a* and the second lower insulating layer 74, and contact a corresponding one of the plurality of the first connecting elements 70*a*. The redistribution via portion of the first lower redistribution pattern 70*a* may penetrate the first lower insulating layer 62*a* and electrically connect the redistribution conductive pattern portion of the first lower redistribution pattern 70*a* to the semiconductor chip 40. A second lower redistribution pattern 70*b* may include a redistribution conductive pattern portion and a redistribution via portion connected to the redistribution conductive pattern portion. The redistribution conductive pattern portion of the second lower redistribution pattern 70*b* may be provided between the first lower insulating layer 62*a* and the second lower insulating layer 74, and contact a corresponding one of the plurality of the second connecting elements 70*b*. The redistribution via portion of the second lower redistribution pattern 70*b* may penetrate the first lower insulating layer 62*a* and electrically connect the redistribution conductive pattern portion of the second lower redistribution pattern 70*b* to a corresponding one of the plurality of conductive structures of the connection substrate 25.

The first connecting element 64*a* may penetrate the second lower insulating layer 74 and contact the first lower redistribution pattern 70*a*. The second connecting element 64*b* may penetrate the second lower insulating layer 74 and contact the second lower redistribution pattern 70*b*. The under-fill layer 92 may be interposed between the second lower insulating layer 74 and the package substrate 90. Upper redistribution patterns 56*a* may be interposed between the first upper insulating layer 52 and second upper insulating layer 68. The second upper insulating layer 68 may include the openings 58*h* through which the upper redistribution patterns 56*a* are exposed. Except for the afore-described structural features, the semiconductor package of FIG. 5 may be configured to have the same or substantially similar structural features as those of FIG. 2.

In the semiconductor package 100a of FIG. 5, the semiconductor chip 40 and the connection substrate 25 may be electrically connected to each other through the first and second lower redistribution patterns 70a and 70b constituting a single-layered lower re-distribution layer. Furthermore, the semiconductor chip 40 and the connection substrate 25 may also be electrically connected to each other through the package substrate 90. Because the single-layered lower re-distribution layer is used for the semiconductor package 100a of FIG. 5, the number of layers constituting the package substrate 90 may be reduced. According to the present example embodiments, the semiconductor package 100a includes the package substrate 90, which includes a plurality of lower re-distribution layers and may serve as a multi-layered re-distribution structure. Thus, an overall process time may be reduced and a fabrication yield may be increased without forming a multi-layered re-distribution structure in a preliminary structure including the semiconductor chip 40, the connection substrate 25, and the mold layer 50.

Figure 6:
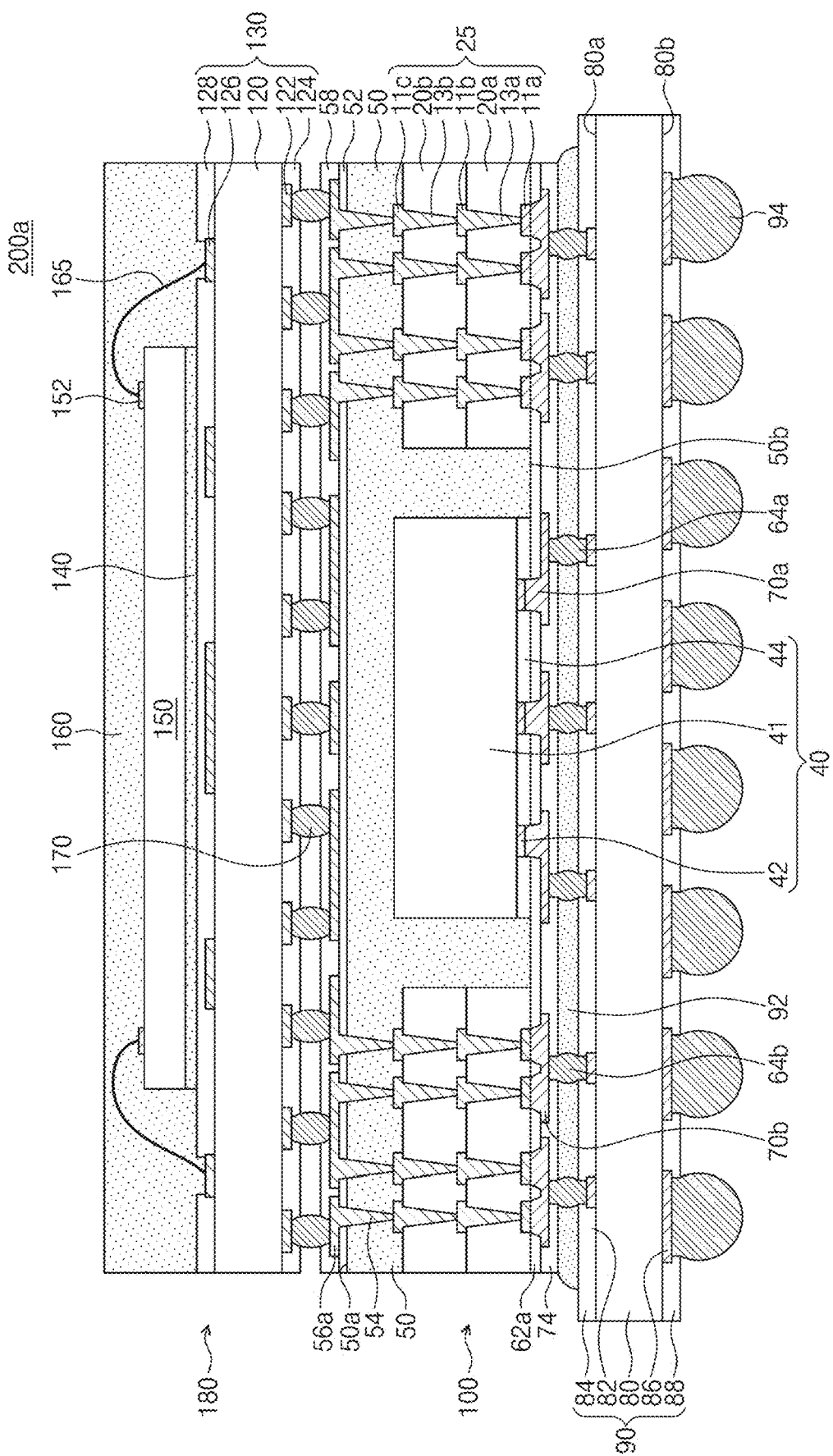
FIG. 6 is a sectional view illustrating a package-on-package device according to an example embodiment of the inventive concepts.

FIG. 6 is a sectional view illustrating a package-on-package device according to an example embodiment of the inventive concepts.

Referring to FIG. 6, in a package-on-package device 200a according to the present example embodiment, a second semiconductor package 180 may be mounted on a first semiconductor package 100a. The first semiconductor package 100a may have the same or substantially similar structure as the semiconductor package 100a described with reference to FIG. 2.

The second semiconductor package 180 may have the same or substantially similar structure as the second semiconductor package 180 described with reference to FIG. 3. The first semiconductor package 100 may be electrically connected to the second semiconductor package 180 through package connecting elements 170. The package connecting elements 170 may connect the second substrate lower conductive patterns 122 to the upper redistribution patterns 56a, which are exposed through the openings 58h of the second upper insulating layer 58.

FIGS. 7A, 7B, 7C, 7D, and 7E are sectional views sequentially illustrating a process of fabricating the semiconductor package of FIG. 5.

Figure 7A:
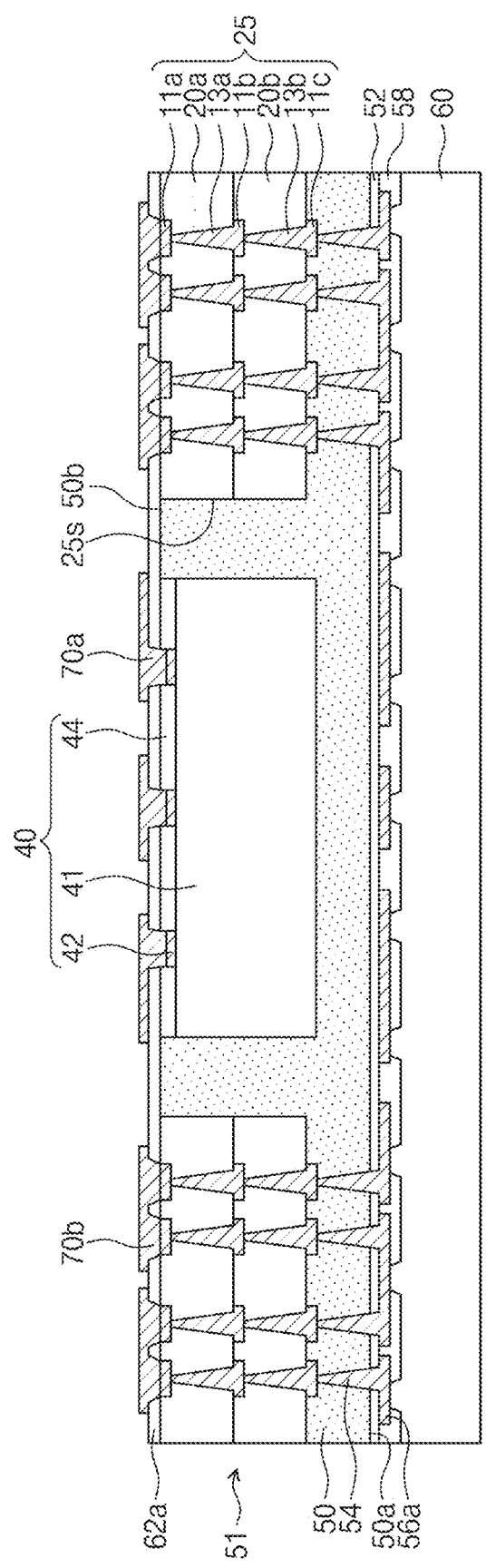
FIGS. 7A, 7B, 7C, 7D, and 7E are sectional views sequentially illustrating a process of fabricating the semiconductor package of FIG. 5.

Referring to FIG. 7A, the preliminary structure 51 of FIG. 4I may be inverted (e.g., may be flipped upside down), and then, the first lower insulating layer 62a may be patterned to form via holes, through which the first connection conductive patterns 11a are exposed. A conductive layer may be formed on the first lower insulating layer 62a to fill the via holes, and patterned to form the lower redistribution patterns 70a and 70b.

Figure 7B:
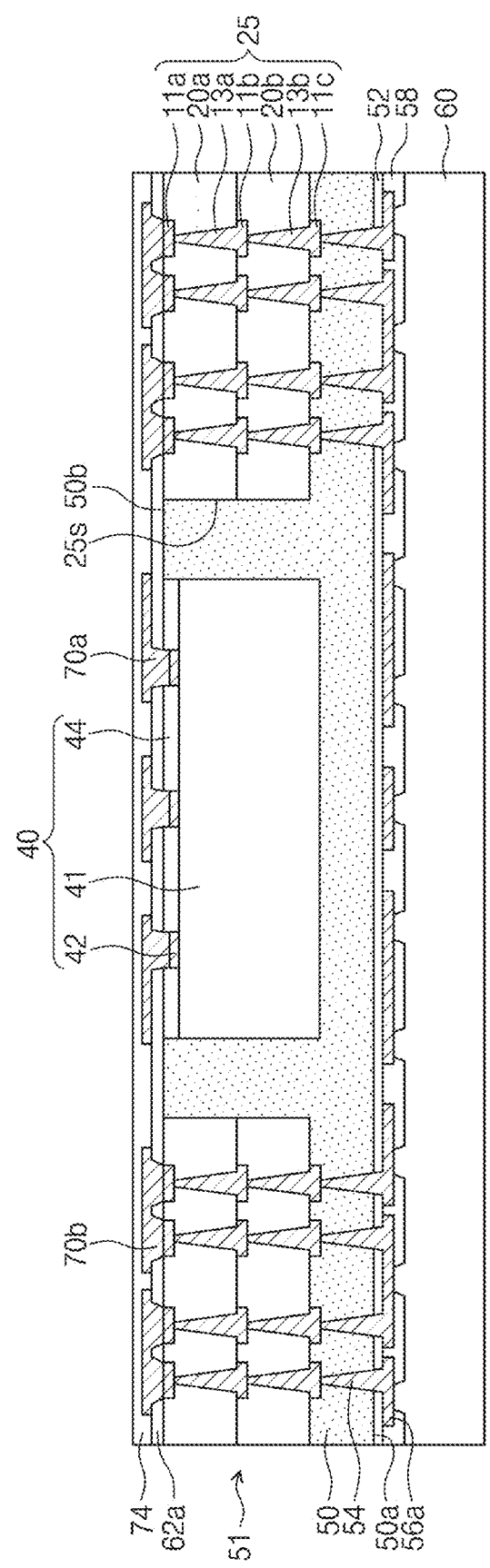
Figure 7C:
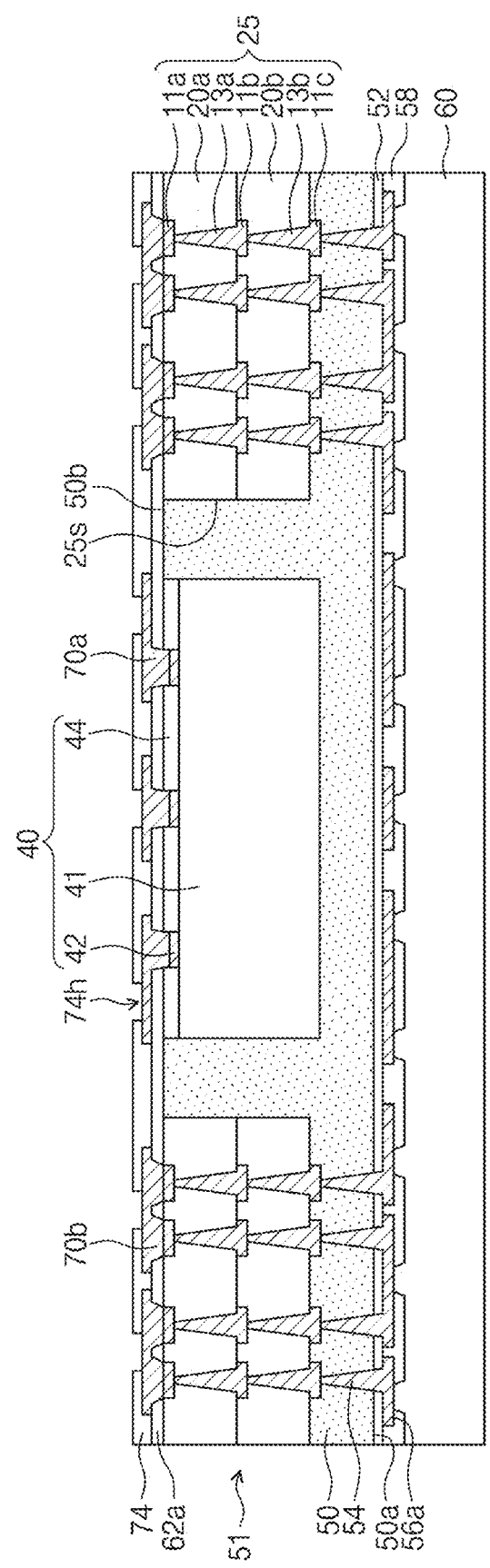

Referring to FIGS. 7B and 7C, the second lower insulating layer 74 may cover the lower redistribution patterns 70a and 70b and the first lower insulating layer 62a. The second lower insulating layer 74 may be patterned to form lower openings 74h exposing lower redistribution patterns 70a and 70b.

Figure 7D:
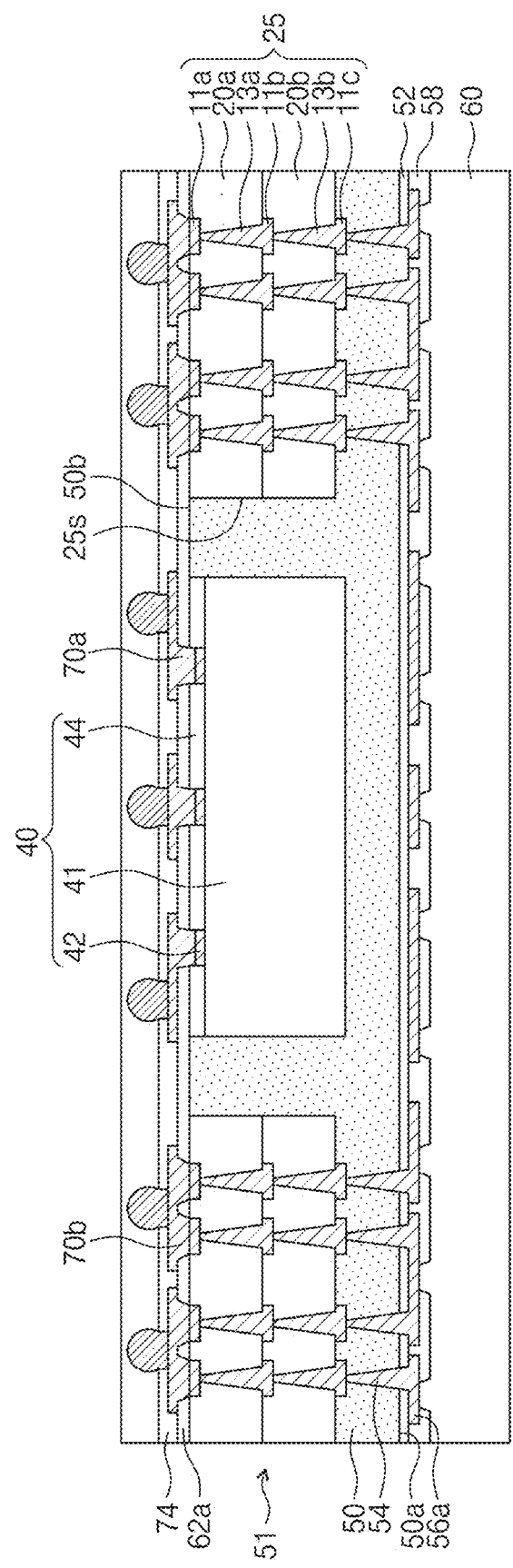

Referring to FIG. 7D, the first and second connecting elements 64a and 64b may be bonded on the lower redistribution patterns 70a and 70b, respectively. The protection layer 66 may be formed to cover the first and second connecting elements 64a and 64b and the second lower insulating layer 74. The protection layer 66 may be, for example, a single sided tape.

Figure 7E:
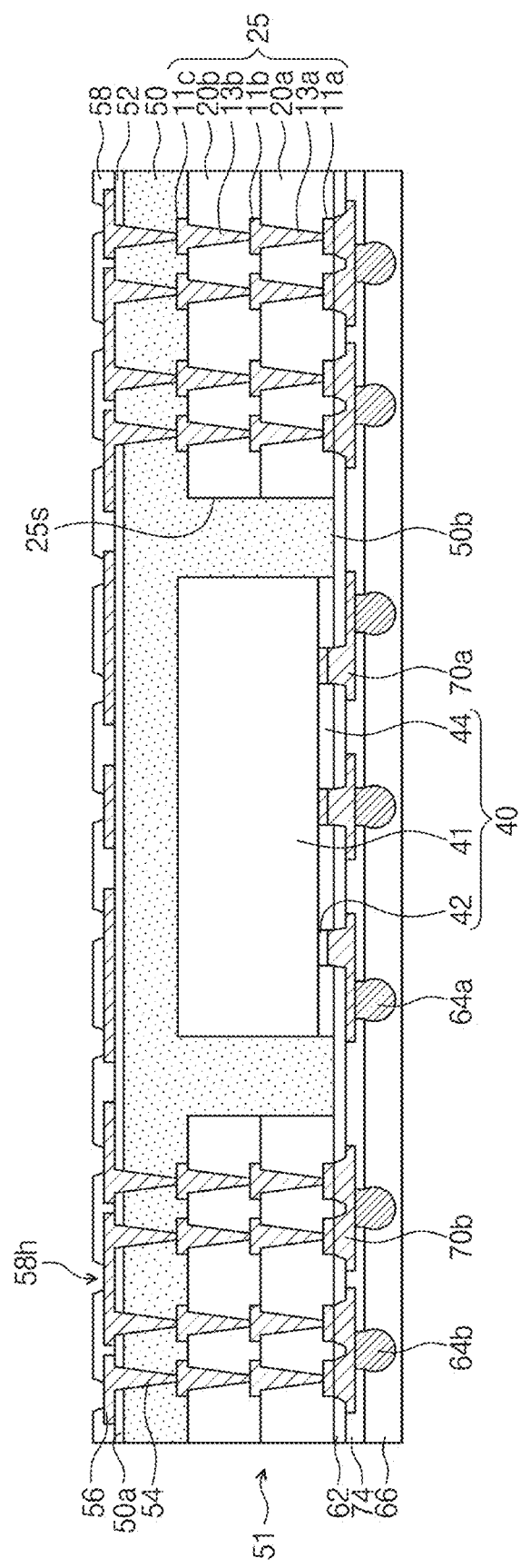

Referring to FIGS. 7D and 7E, the second carrier substrate 60 may be detached from the second upper insulating layer 58. Thereafter, the preliminary structure 51 may be inverted (e.g., may be flipped upside down) such that the mold top surface 50a faces upward, and then the second upper insulating layer 58 may be patterned to form the upper opening 58h exposing the upper redistribution pattern 56a. Subsequent steps may be performed in the same or substantially similar manner as those described with reference to FIGS. 4O, 4P, and 2.

Figure 8:
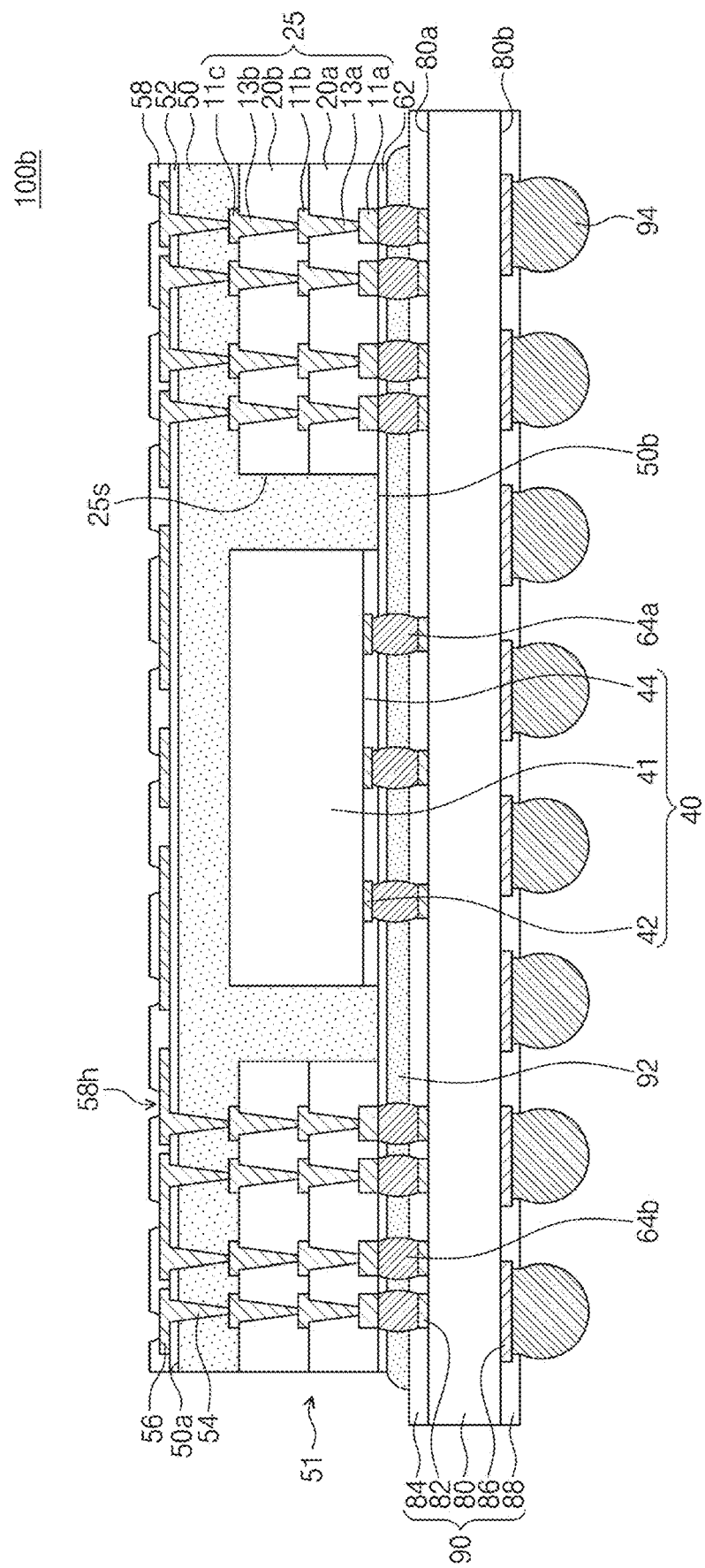
FIG. 8 is a sectional view illustrating a semiconductor package according to an example embodiment of the inventive concepts.

FIG. 8 is a sectional view illustrating a semiconductor package according to an example embodiment of the inventive concept.

Referring to FIG. 8, in a semiconductor package 100b according to the present example embodiment, the first connection conductive pattern 11a may be thicker than the second and third connection conductive patterns 11b and 11c. Except for the afore-described structural features, the semiconductor package of FIG. 8 may be configured to have the same or substantially similar structural features as those of FIG. 2. The semiconductor package 100b of FIG. 8 may be fabricated as follows. First, the first connection conductive pattern 11a may be formed to be thicker than the second and third connection conductive patterns 11b and 11c as illustrated in FIG. 4A. Then, subsequent processes as illustrated in FIGS. 4B to 4P may be performed. Accordingly, the semiconductor package 100b as shown in FIG. 8 may be fabricated.

Figure 9:
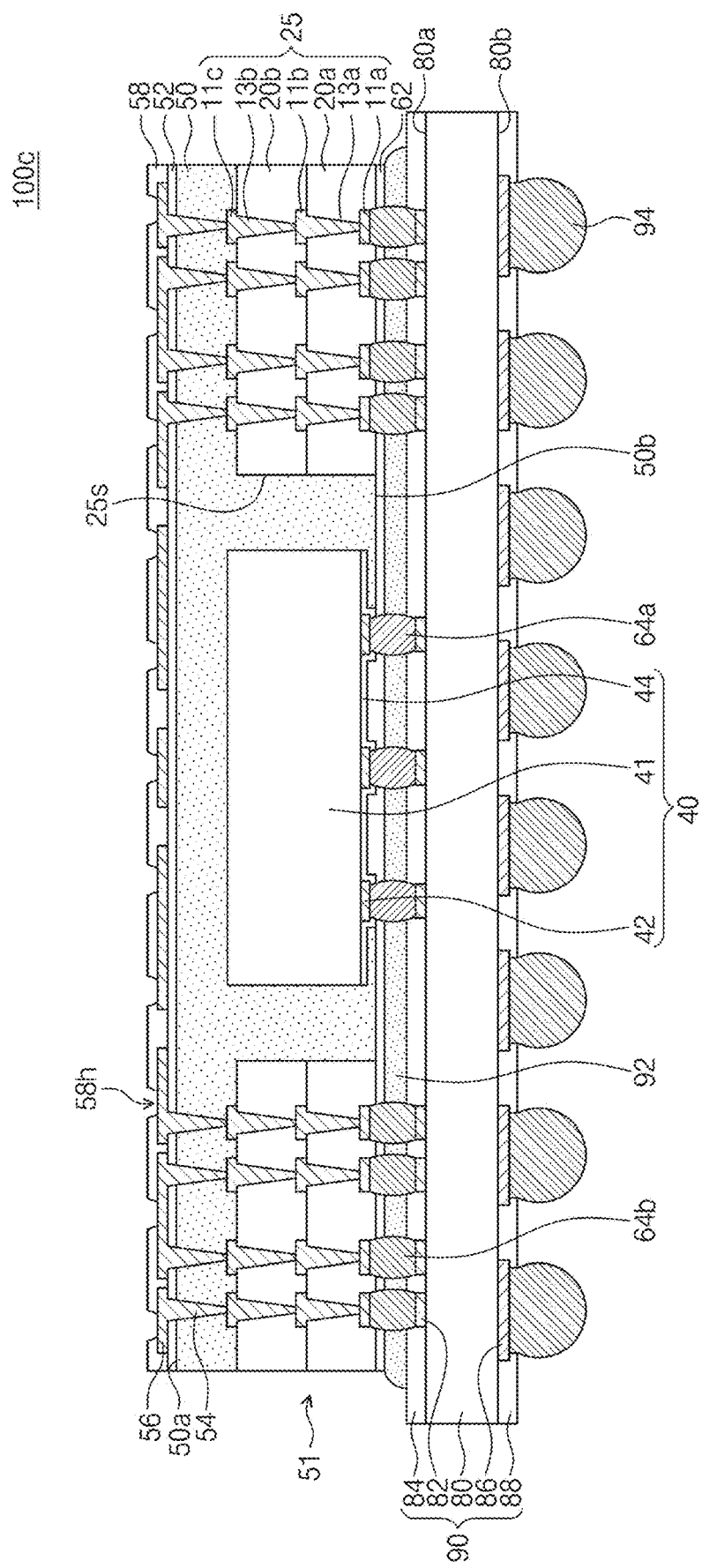
FIG. 9 is a sectional view illustrating a semiconductor package according to an example embodiment of the inventive concepts.

FIG. 9 is a sectional view illustrating a semiconductor package according to an example embodiment of the inventive concepts.

Referring to FIG. 9, in a semiconductor package 100c according to the present example embodiment, a bottom surface of the first connection conductive pattern 11a may be higher than a bottom surface of the first connection insulating layer 20a. A portion of the second connecting element 64b may be extended into the first connection insulating layer 20a. The mold bottom surface 50b may be substantially coplanar with a bottom surface of the first connection insulating layer 20a. A thickness of the chip passivation layer 44 of FIG. 9 may be smaller than a thickness of the chip passivation layer 44 shown in FIG. 2. A portion of the mold layer 50 may be extended into a space between the chip passivation layer 44 and the lower insulating layer 62. In certain example embodiments, a portion of the mold layer 50 may be extended to cover a bottom surface of the semiconductor chip 40. A thickness of the lower insulating layer 62 may vary from position to position. For example, the thickness of the lower insulating layer 62 below the first connection insulating layer 20a may be smaller than the thickness of the lower insulating layer 62 between the chip conductive pads 42. Except for the afore-described structural features, the semiconductor package of FIG. 9 may be configured to have the same or substantially similar structural features as those of FIG. 2.

The semiconductor package 100c of FIG. 9 may be fabricated as follows. The first connection conductive pattern 11a may be formed to be thicker than the second and third connection conductive patterns 11b and 11c as illustrated in FIG. 4A. Then, a portion of the first connection conductive pattern 11a may be etched to reduce the thickness of the first connection conductive pattern 11a as illustrated in FIG. 4B. Thereafter, subsequent processes as illustrated in FIGS. 4C to 4P may be performed. Accordingly, the semiconductor package 100c as shown in FIG. 9 may be fabricated.

Figure 10:
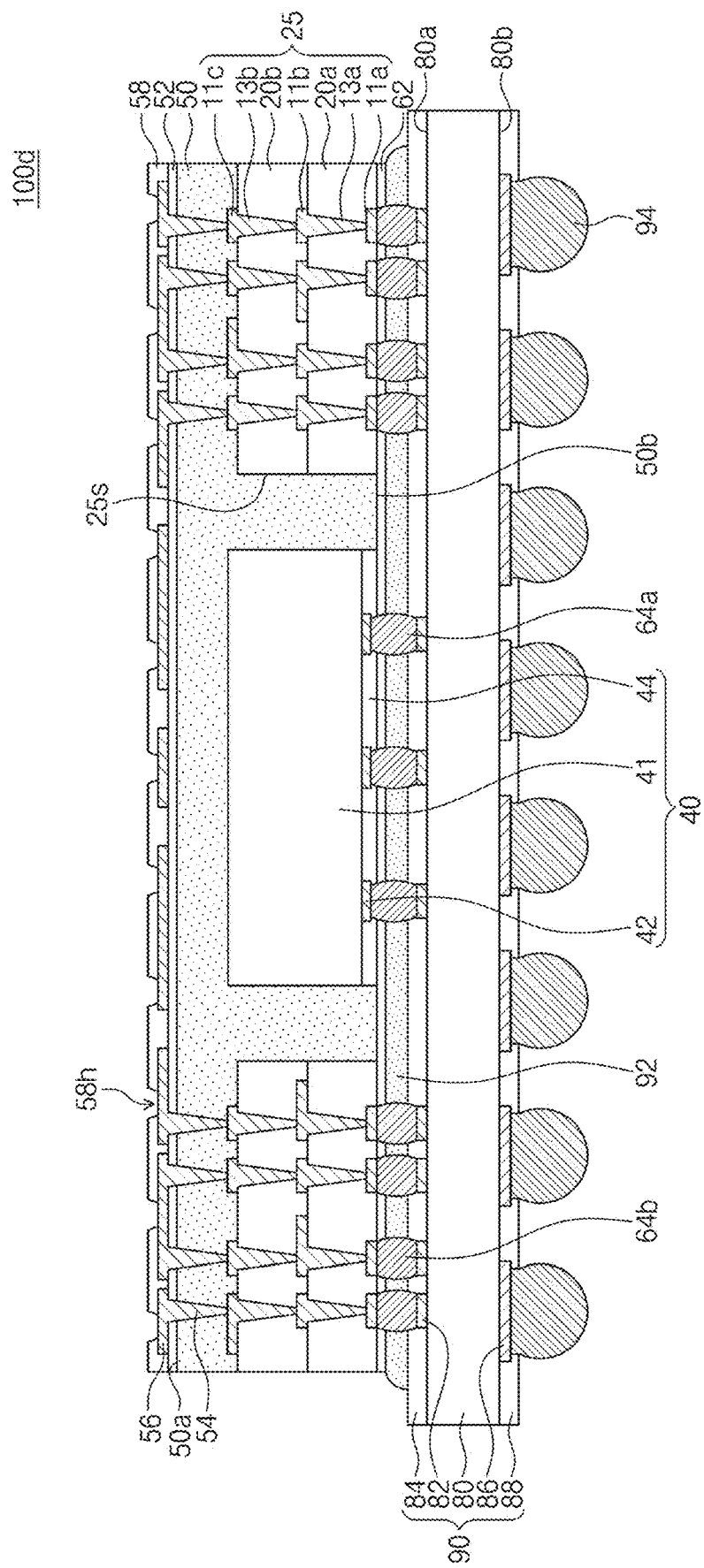
FIG. 10 is a sectional view illustrating a semiconductor package according to an example embodiment of the inventive concepts.

FIG. 10 is a sectional view illustrating a semiconductor package according to an example embodiment of the inventive concepts.

Referring to FIG. 10, in a semiconductor package 100d according to the present example embodiment, at least one of the second and third connection conductive patterns 11b and 11c may be provided to serve as an internal interconnection line. For example, at least one of the second and third connection conductive patterns 11b and 11c may extend in a specific direction. Accordingly, a high degree of freedom in constructing a routing structure or an internal interconnection structure may be realized.

Figure 11:
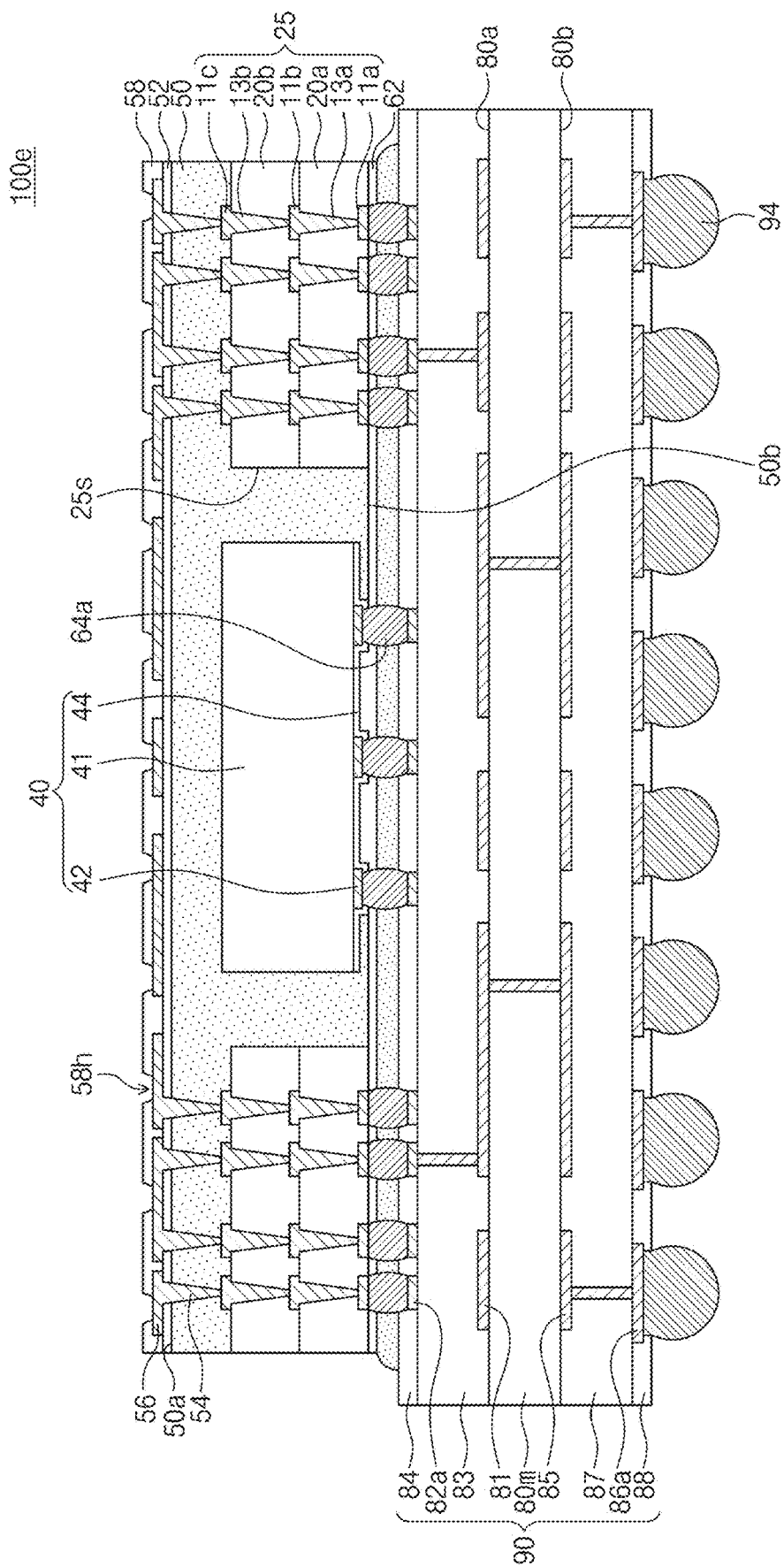
FIG. 11 is a sectional view illustrating a semiconductor package according to an example embodiment of the inventive concepts.

FIG. 11 is a sectional view illustrating a semiconductor package according to an example embodiment of the inventive concepts.

Referring to FIG. 11, in a semiconductor package 100e according to the present example embodiment, a package substrate 90a may be provided to have a multi-layered PCB structure. For example, the package substrate 90a may include an intermediate substrate body 80m, an upper substrate body 83 provided on a substrate top surface 80a of the intermediate substrate body 80m, and a lower substrate body 87 provided on a substrate bottom surface 80b of the intermediate substrate body 80m. A top surface of the upper substrate body 83 may be covered with the substrate upper passivation layer 84. A bottom surface of the lower substrate body 87 may be covered with the substrate lower passivation layer 88. First substrate upper conductive patterns 81 may be disposed between the intermediate substrate body 80m and the upper substrate body 83. Second substrate upper conductive patterns 82a may be disposed between the upper substrate body 83 and the substrate upper passivation layer 84. First substrate lower conductive patterns 85 may be provided between the intermediate substrate body 80m and the lower substrate body 87. Second substrate lower conductive patterns 86a may be disposed between the lower substrate body 87 and the substrate lower passivation layer 88. Each of the intermediate substrate body 80m, the upper substrate body 83, and the lower substrate body 87 may be formed of or include at least one of thermosetting resins (e.g., epoxy resin), thermoplastic resins (e.g., polyimide), composite materials (e.g., prepreg), in which a reinforcement element (e.g., glass fiber and/or inorganic filler) is pre-impregnated with a thermoplastic or thermosetting resin matrix, or photo-curable resins, but the inventive concepts are not limited thereto. Except for the afore-described structural features, the semiconductor package of FIG. 11 may be configured to have the same or substantially similar structural features as those of FIG. 9.

Figure 12:
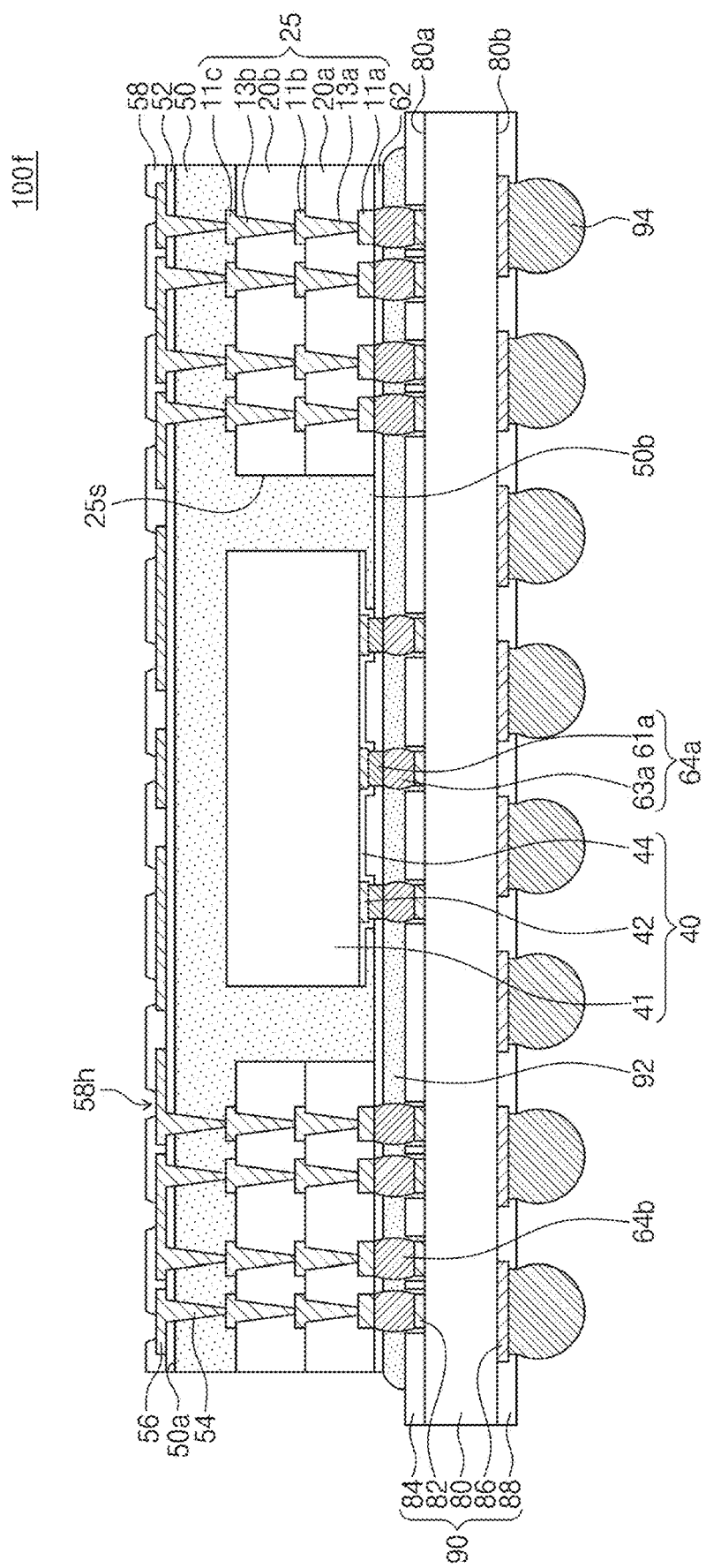
FIG. 12 is a sectional view illustrating a semiconductor package according to an example embodiment of the inventive concepts.

FIG. 12 is a sectional view illustrating a semiconductor package according to an example embodiment of the inventive concepts.

Referring to FIG. 12, in a semiconductor package 100f according to the present example embodiment, each of first connecting elements 64a may include a first conductive pillar 61a and a first conductive bump 63a. The first conductive pillar 61a may contact the chip conductive pad 42. The first conductive pillar 61a may be formed of or include copper. The first conductive bump 63a may be interposed between the first conductive pillar 61a and a corresponding one of the substrate upper conductive patterns 82. The first conductive bump 63a may be formed of or include at least one of tin or lead. Except for the afore-described structural features, the semiconductor package of FIG. 12 may be configured to have the same or substantially similar structural features as those of FIG. 9.

Figure 13:
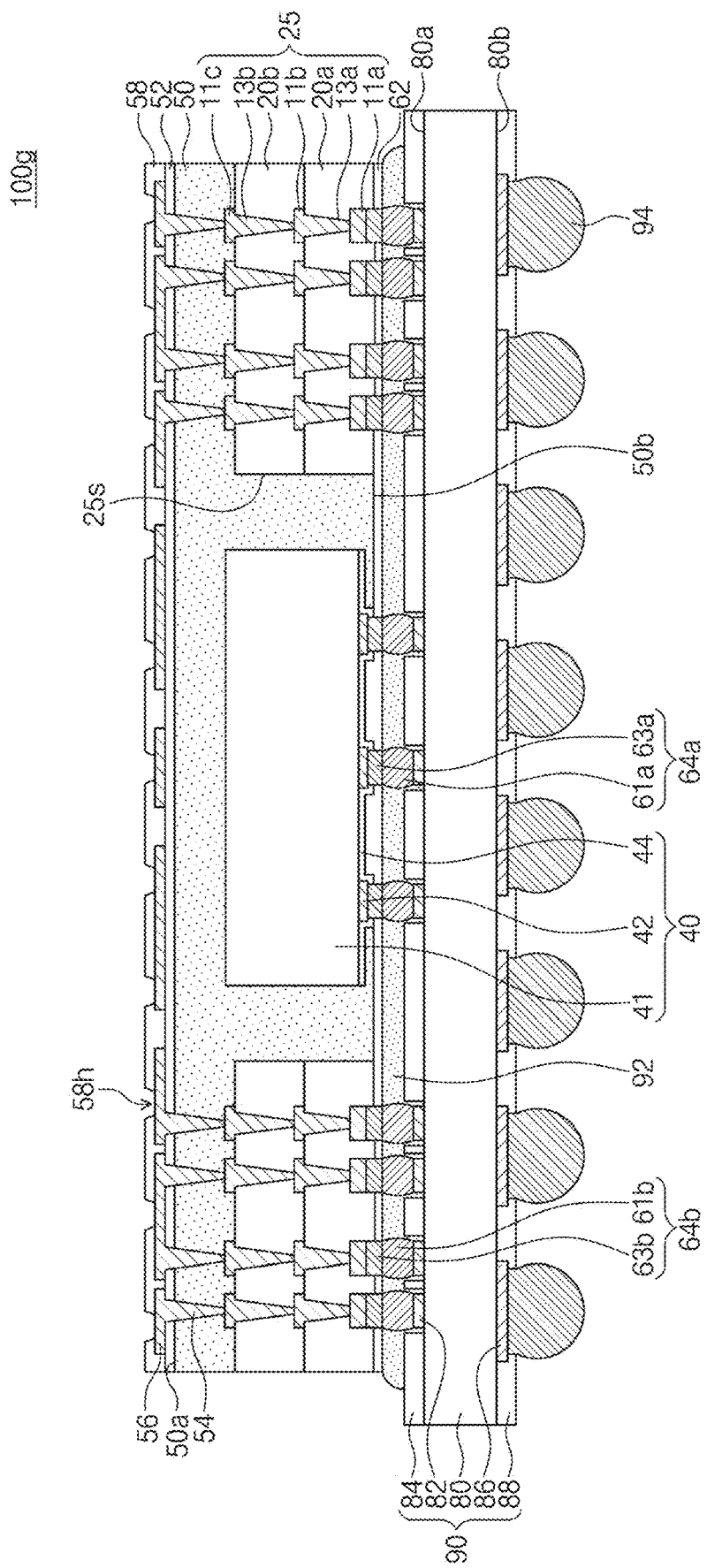
FIG. 13 is a sectional view illustrating a semiconductor package according to an example embodiment of the inventive concepts.

FIG. 13 is a sectional view illustrating a semiconductor package according to an example embodiment of the inventive concepts.

Referring to FIG. 13, in a semiconductor package 100g according to the present example embodiment, each of second connecting elements 64b may include a second conductive pillar 61b and a second conductive bump 63b. The second conductive pillar 61b may be in contact with the first connection conductive pattern 11a. The second conductive pillar 61b may be formed of or include copper. The second conductive bump 63b may be interposed between the second conductive pillar 61b and a corresponding one one of the substrate upper conductive patterns 82. The second conductive bump 63b may be formed of or include at least one of tin or lead. Except for the afore-described structural features, the semiconductor package of FIG. 13 may be configured to have the same or similar substantially structural features as those of FIG. 12.

Figure 14:
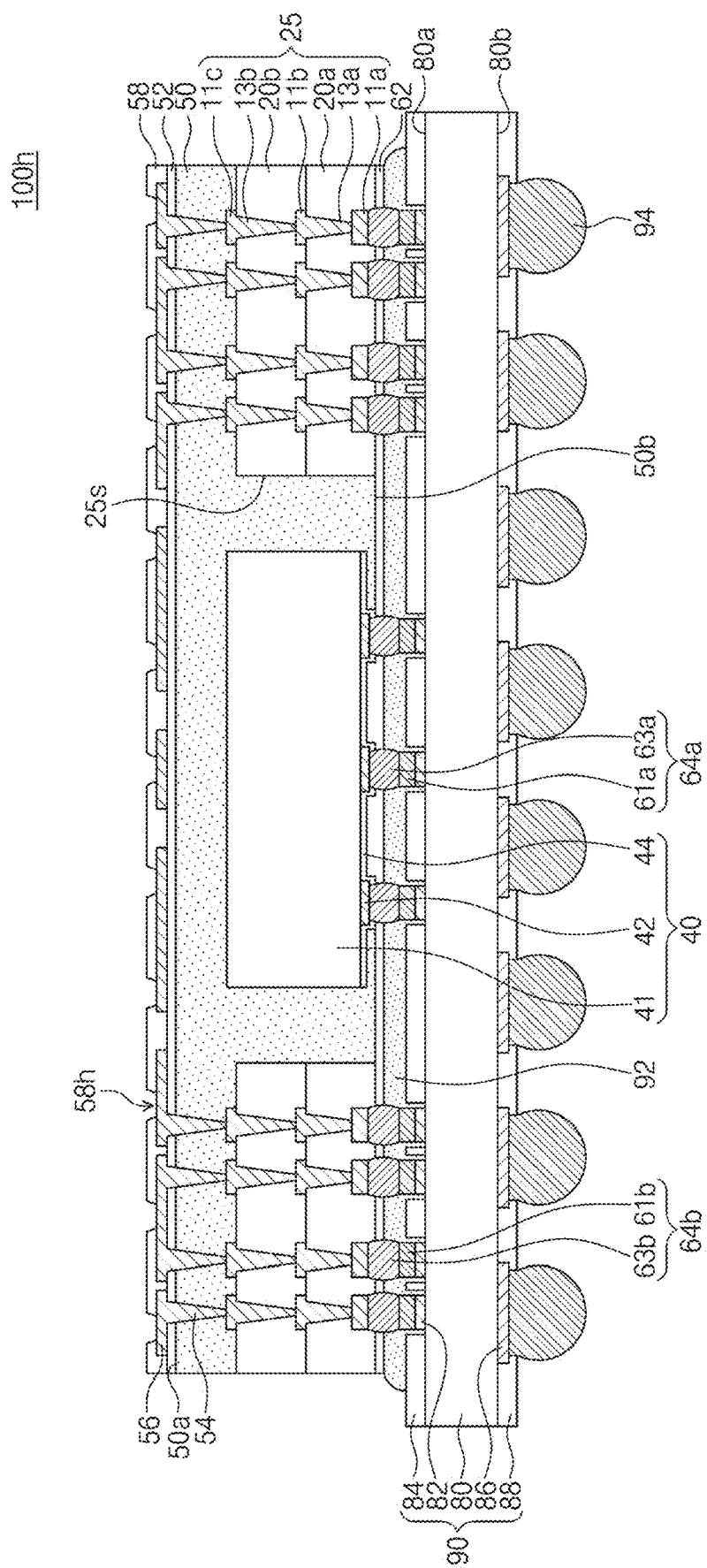
FIG. 14 is a sectional view illustrating a semiconductor package according to an example embodiment of the inventive concepts.

FIG. 14 is a sectional view illustrating a semiconductor package according to an example embodiment of the inventive concepts.

Referring to FIG. 14, in a semiconductor package 100h according to the present example embodiment, each of first connecting elements 64a may include a first conductive pillar 61a and a first conductive bump 63a, and each of second connecting elements 64b may include a second conductive pillar 61b and a second conductive bump 63b. The first conductive pillar 61a may contact one of the substrate upper conductive patterns 82, and the second conductive pillar 61b may contact another of the substrate upper conductive patterns 82. The first conductive bump 63a may be interposed between the first conductive pillar 61a and the chip conductive pad 42. The second conductive bump 63b may be interposed between the second conductive pillar 61b and the first connection conductive pattern 11a. Except for the afore-described structural features, the semiconductor package of FIG. 14 may be configured to have the same or substantially similar structural features as those of FIG. 13.

Figure 15:
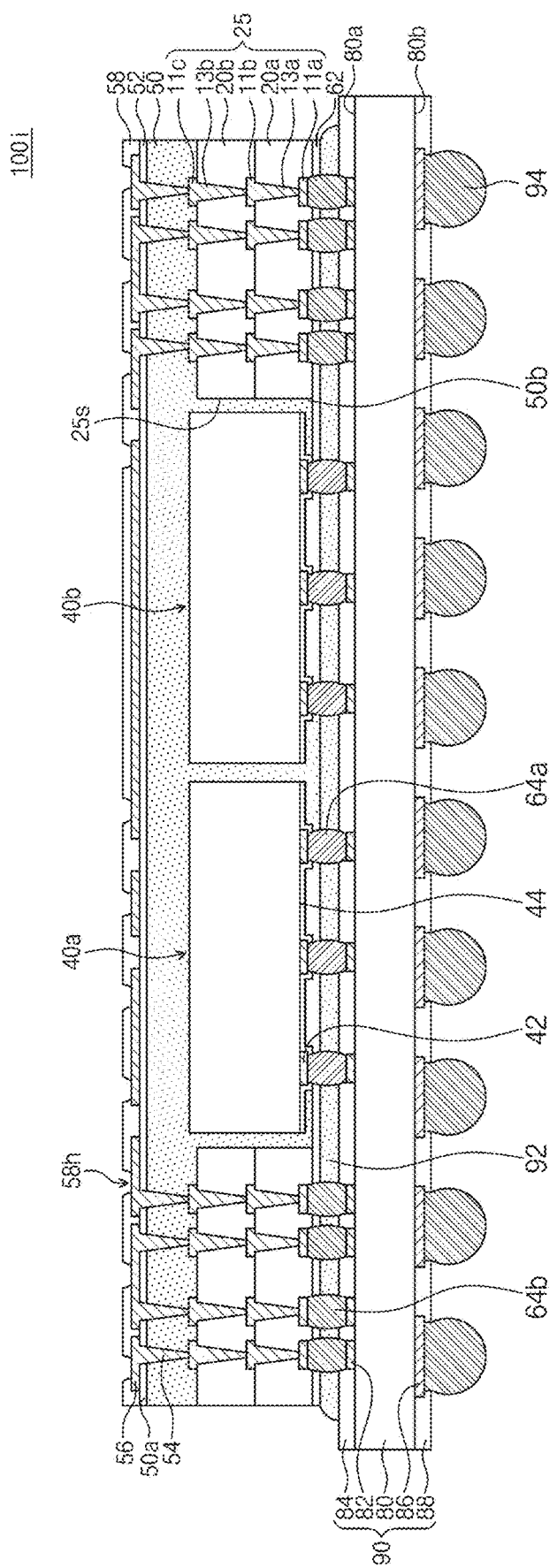
FIG. 15 is a sectional view illustrating a semiconductor package according to an example embodiment of the inventive concepts.

FIG. 15 is a sectional view illustrating a semiconductor package according to an example embodiment of the inventive concepts.

Referring to FIG. 15, in a semiconductor package 100i according to the present example embodiment, two semiconductor chips 40a and 40b may be mounted on the package substrate 90 to be placed in the cavity 25s of the connection substrate 25. The semiconductor chips 40a and 40b may include a first semiconductor chip 40a and a second semiconductor chip 40b. The first semiconductor chip 40a and the second semiconductor chip 40b may be of the same or different kinds. The first semiconductor chip 40a may be spaced apart from the second semiconductor chip 40b. A mold layer 50 may fill a space between the first semiconductor chip 40a and the second semiconductor chip 40b. Except for the afore-described structural features, the semiconductor package of FIG. 15 may be configured to have the same or substantially similar structural features as those of FIG. 9.

Figure 16:
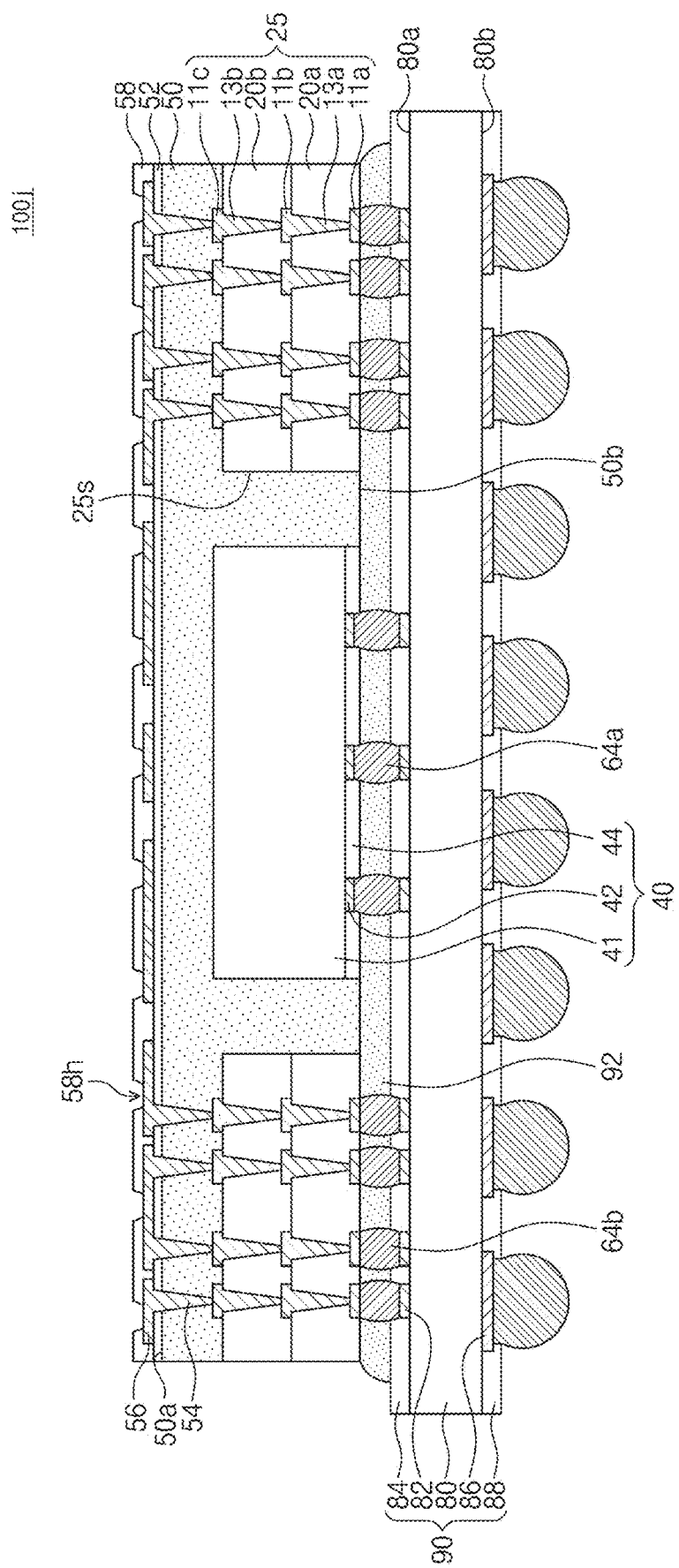
FIG. 16 is a sectional view illustrating a semiconductor package according to an example embodiment of the inventive concepts.

FIG. 16 is a sectional view illustrating a semiconductor package according to an example embodiment of the inventive concepts.

Referring to FIG. 16, a semiconductor package 100j according to the present example embodiment may have the same structure of FIG. 2, except for the absence of the lower insulating layer 62. For example, in the semiconductor package 100j, the under-fill layer 92 may directly contact the first connection insulating layer 20a, the mold layer 50, and the chip passivation layer 44.

The semiconductor package 100j may be fabricated as follows. According to one example embodiment, the first carrier substrate 59 may be attached to the semiconductor chip 40, the connection substrate 25, and the mold layer 50, without the lower insulating layer 62 as illustrated in FIG. 4G, and then subsequent processes may be performed in the afore-described manner to fabricate the semiconductor package 100j of FIG. 16. According to another example embodiment, the process as illustrated in FIG. 4G may be omitted, and the second sacrificial substrate 30 (instead of the first carrier substrate 59) may be used in subsequent steps as illustrated in FIG. 4F. In such case, the lower insulating layer 62 may not be formed, and thus the under-fill layer 92 may directly contact the first connection insulating layer 20a, the mold layer 50, and the chip passivation layer 44.

Figure 17:
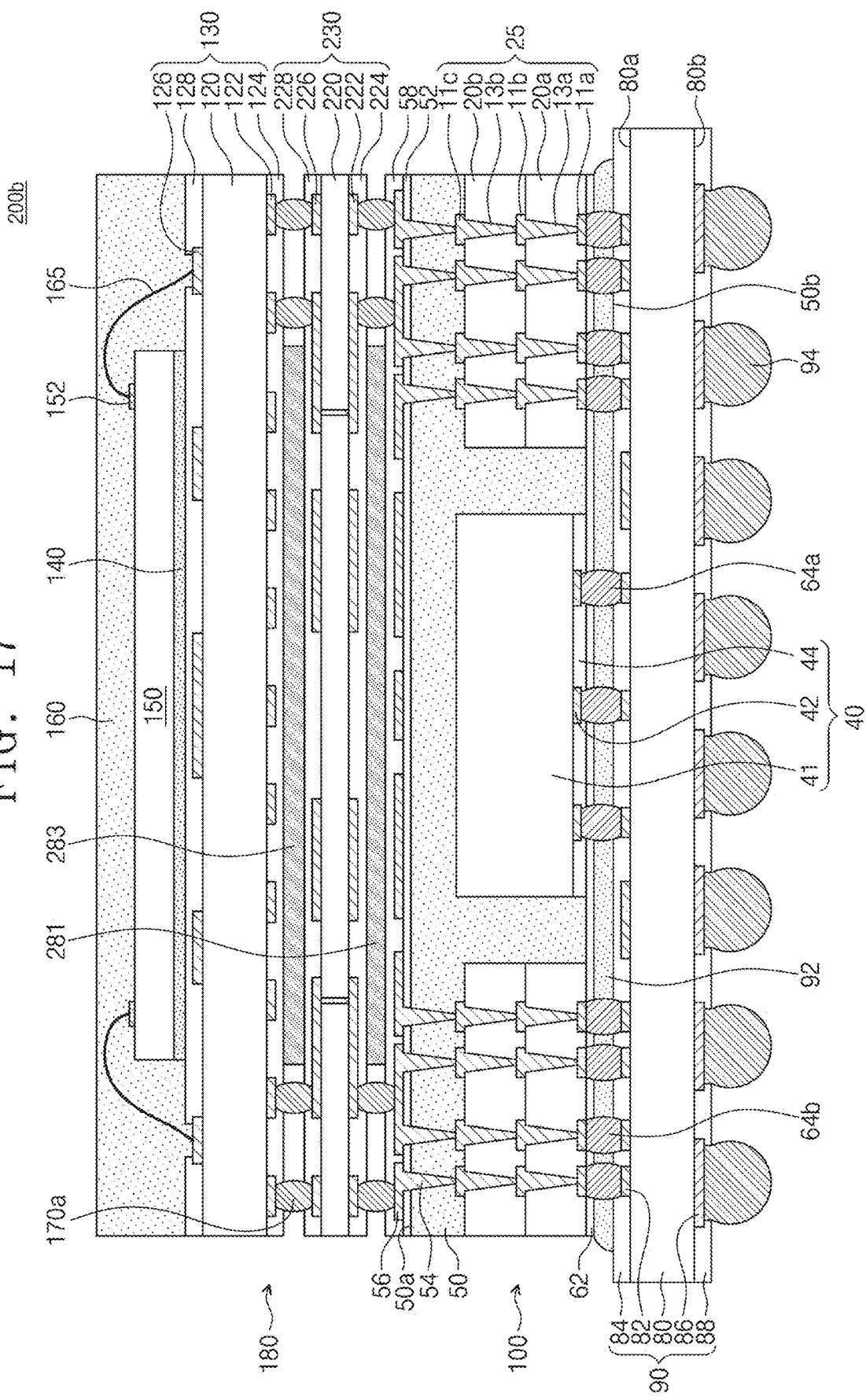
FIG. 17 is a sectional view illustrating a package-on-package device according to an example embodiment of the inventive concepts.

FIG. 17 is a sectional view illustrating a package-on-package device according to an example embodiment of the inventive concepts.

Referring to FIG. 17, a package-on-package device 200b according to the present example embodiment may be configured to further include an interposer substrate 230, which is interposed between the first semiconductor package 100 and the second semiconductor package 180, compared with the structure of FIG. 3. The interposer substrate 230 may include an interposer body 220, interposer upper conductive patterns 226, interposer lower conductive patterns 222, an interposer upper passivation layer 228, and an interposer lower passivation layer 224. The interposer body 220 may be a part of a silicon wafer. The first semiconductor package 100 and the interposer substrate 230 may be connected to each other by a first package connecting element 270. The second semiconductor package 180 and the interposer substrate 230 may be connected to each other by a second package connecting element 170a. The redistribution conductive pattern portion of the upper redistribution pattern 56 may be connected to the interposer substrate via the plurality of first package connecting elements 270, and the second package substrate may be connected to the interposer substrate 230 via the plurality of second package connecting elements 170a. A first thermal boundary layer 281 may be interposed between the first semiconductor package 100 and the interposer substrate 230. A second thermal boundary layer 283 may be interposed between the second semiconductor package 180 and the interposer substrate 230. Each of the first and second thermal boundary layers 281 and 283 may include thermal grease or thermal epoxy, and at least one of them may include metallic solid particles. The first and second thermal boundary layers 281 and 283 may be configured to transfer or dissipate heat, which are generated from the first semiconductor package 100, to the second semiconductor package 180 in an improved manner. Accordingly, heat-dissipation characteristics of the package-on-package device 200b may be improved. Except for the afore-described structural features, the semiconductor package of FIG. 17 may be configured to have the same or substantially similar structural features as those of FIG. 3.

In FIG. 17, the first semiconductor package 100 is illustrated to have the same structure as the semiconductor package 100 of FIG. 2. According to certain example embodiments, however, the first semiconductor package 100 may be configured to have the same or substantially similar structure as one of the semiconductor packages shown in FIG. 5 and FIGS. 8 to 16. In addition, the first semiconductor package 100 in each of the package-on-package devices of FIGS. 3 and 6 may be replaced with one of the semiconductor packages shown in FIGS. 2, 5, and 8 to 16.

In semiconductor packages, package-on-package devices, and/or methods of fabricating the same according to some example embodiments of the inventive concepts, a package substrate may be used to replace a multi-layered re-distribution structure below a semiconductor chip, thereby reducing an overall process time and/or increasing fabrication yield.

While some example embodiments of the inventive concepts have been particularly shown and described, it will be understood by one of ordinary skill in the art that variations in form and detail may be made therein without departing from the spirit and scope of the attached claims.

What is claimed is:

1. A semiconductor package comprising:
   a package substrate;
   a semiconductor chip on a first surface of the package substrate;
   a first lower redistribution pattern below the semiconductor chip and electrically connected to the semiconductor chip;
   a connection substrate on the package substrate, the connection substrate spaced apart from and surrounding the semiconductor chip, the connection substrate including two or more connection insulating layers that are sequentially stacked and a plurality of conductive connection structures penetrating corresponding ones of the two or more connection insulating layers;
   a second lower redistribution pattern below the connection substrate and electrically connected to the connection substrate;
   a plurality of first connecting elements between the first lower redistribution pattern and the package substrate, the plurality of first connecting elements electrically connecting the first lower redistribution pattern to the package substrate;
   a plurality of second connecting elements between the second lower redistribution pattern and the package substrate, the plurality of second connecting elements electrically connecting the second lower redistribution pattern to package substrate; and
   a mold layer encapsulating the semiconductor chip and the connection substrate.

2. The semiconductor package of claim 1, further comprising:
   an upper redistribution pattern on the mold layer and the semiconductor chip, the upper redistribution pattern electrically connected to a corresponding one of the plurality of conductive connection structures.

3. The semiconductor package of claim 1, wherein
   the two or more connection insulating layers include sequentially stacked first and second connection insulating layers, and
   the plurality of conductive connection structures include,
      a first connection conductive pattern adjacent to a bottom surface of the first connection insulating layer,
      a second connection conductive pattern interposed between the first and second connection insulating layers, and
      a connection via penetrating the first connection insulating layer and electrically connecting the first connection conductive pattern and the second connection conductive pattern.

4. The semiconductor package of claim 3, wherein the first connection conductive pattern is thicker than the second connection conductive pattern.

5. The semiconductor package of claim 3, wherein a bottom surface of the first connection conductive pattern is higher than the bottom surface of the first connection insulating layer.

6. The semiconductor package of claim 3, wherein the first connection conductive pattern extends in a direction and serves as an internal interconnection line.

7. The semiconductor package of claim 1, wherein the package substrate includes:
a first body and a second body which are sequentially stacked;
a first passivation layer covering a bottom surface of the first body;
a second passivation layer covering a top surface of the second body;
a first substrate conductive pattern between the first passivation layer and the first body;
a second substrate conductive pattern electrically connected to the first substrate conductive pattern between the first body and the second body; and
a third substrate conductive pattern electrically connected to the second substrate conductive pattern between the second body and the second passivation layer.

8. A semiconductor package comprising:
a package substrate;
a semiconductor chip on a first surface of the package substrate;
a connection substrate on the package substrate, the connection substrate spaced apart from and surrounding the semiconductor chip, the connection substrate including two or more connection insulating layers that are sequentially stacked and a plurality of conductive connection structures penetrating corresponding ones of the two or more connection insulating layers;
a first lower redistribution pattern below the connection substrate and electrically connected to the connection substrate;
a plurality of first connecting elements between the first lower redistribution pattern and the package substrate, the plurality of first connecting elements electrically connecting the first lower redistribution pattern to the package substrate; and
a mold layer encapsulating the semiconductor chip and the connection substrate.

9. The semiconductor package of claim 8, further comprising:
a second lower redistribution pattern below the semiconductor chip and electrically connected to the semiconductor chip; and
a plurality of second connecting elements between the second lower redistribution pattern and the package substrate, the plurality of second connecting elements electrically connecting the second lower redistribution pattern to the package substrate.

10. The semiconductor package of claim 8, further comprising:
an upper redistribution pattern on the mold layer and the semiconductor chip, the upper redistribution pattern electrically connected to a corresponding one of the plurality of conductive connection structures.

11. The semiconductor package of claim 8, wherein
the two or more connection insulating layers include sequentially stacked first and second connection insulating layers, and
the plurality of conductive connection structures include,
a first connection conductive pattern adjacent to a bottom surface of the first connection insulating layer,
a second connection conductive pattern interposed between the first and second connection insulating layers, and
a connection via penetrating the first connection insulating layer and electrically connecting the first connection conductive pattern and the second connection conductive pattern.

12. The semiconductor package of claim 11, wherein the first connection conductive pattern is thicker than the second connection conductive pattern.

13. The semiconductor package of claim 11, wherein a bottom surface of the first connection conductive pattern is higher than the bottom surface of the first connection insulating layer.

14. The semiconductor package of claim 11, wherein the first connection conductive pattern extends in a direction and serves as an internal interconnection line.

15. A semiconductor package comprising:
a first semiconductor unit package including,
a first package substrate,
a first semiconductor chip on a first surface of the first package substrate,
a first lower redistribution pattern below the first semiconductor chip and electrically connected to the first semiconductor chip,
a connection substrate on the first package substrate, the connection substrate spaced apart from and surrounding the first semiconductor chip, the connection substrate including two or more connection insulating layers that are sequentially stacked and a plurality of conductive connection structures penetrating corresponding ones of the two or more connection insulating layers,
a second lower redistribution pattern below the connection substrate and electrically connected to the connection substrate,
a plurality of first connecting elements between the first lower redistribution pattern and the first package substrate, the plurality of first connecting elements electrically connecting the first lower redistribution pattern to the first package substrate,
a plurality of second connecting elements between the second lower redistribution pattern and the package substrate, the plurality of second connecting elements electrically connecting the second lower redistribution pattern to the first package substrate, and
a mold layer encapsulating the first semiconductor chip and the connection substrate, and
a second semiconductor unit package electrically connected to the connection substrate of the first semiconductor unit package, the second semiconductor unit package including,
a second package substrate, and
a second semiconductor chip on a first surface of the second package substrate.

16. The semiconductor package of claim 15, wherein the first semiconductor unit package further includes an upper redistribution pattern on the mold layer and the first semiconductor chip, the upper redistribution pattern electrically connected to a corresponding one of the plurality of conductive connection structures.

17. The semiconductor package of claim 15, wherein
the two or more connection insulating layers include sequentially stacked first and second connection insulating layers, and
the plurality of conductive connection structures include,
a first connection conductive pattern adjacent to a bottom surface of the first connection insulating layer, a second connection conductive pattern interposed between the first and second connection insulating layers, and a connection via penetrating the first connection insulating layer and electrically connecting the first connection conductive pattern and the second connection conductive pattern.

18. The semiconductor package of claim 17, wherein the first connection conductive pattern is thicker than the second connection conductive pattern.

19. The semiconductor package of claim 17, wherein a bottom surface of the first connection conductive pattern is higher than the bottom surface of the first connection insulating layer.

20. The semiconductor package of claim 17, wherein the first connection conductive pattern extends in a direction and serves as an internal interconnection line.

* * * * *